(12) United States Patent
Kitamura

(10) Patent No.: US 12,555,753 B2
(45) Date of Patent: Feb. 17, 2026

(54) APPARATUS FOR PLASMA PROCESSING AND PLASMA PROCESSING SYSTEM

(71) Applicant: Tokyo Electron Limited, Tokyo (JP)

(72) Inventor: Shingo Kitamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 420 days.

(21) Appl. No.: 17/525,190

(22) Filed: Nov. 12, 2021

(65) Prior Publication Data

US 2022/0157575 A1   May 19, 2022

(30) Foreign Application Priority Data

Nov. 13, 2020   (JP) ................. 2020-189256

(51) Int. Cl.
*H01J 37/32* (2006.01)

(52) U.S. Cl.
CPC .. *H01J 37/32642* (2013.01); *H01J 37/32724* (2013.01); *H01J 2237/20235* (2013.01)

(58) Field of Classification Search
CPC .......... H01J 37/32642; H01J 37/32724; H01J 2237/20235; H01J 2237/332–3348; H01L 21/67242; H01L 21/67207
USPC .............. 156/345.51, 345.1–345.55 W; 118/715–733 W
See application file for complete search history.

(56) References Cited

U.S. PATENT DOCUMENTS

| 2009/0294064 | A1* | 12/2009 | Nagayama | ........ | H01J 37/32623 |
| | | | | | 156/345.39 |
| 2011/0031111 | A1* | 2/2011 | Kobayashi | ........ | H01J 37/32623 |
| | | | | | 204/298.36 |
| 2015/0340255 | A1* | 11/2015 | Parkhe | .............. | H01L 21/67248 |
| | | | | | 165/80.5 |
| 2017/0084449 | A1* | 3/2017 | Dube | ................. | H01L 21/02172 |
| 2019/0013232 | A1* | 1/2019 | Yan | .................... | H01L 21/67069 |
| 2021/0043495 | A1* | 2/2021 | Kawasaki | ......... | H01J 37/32082 |
| 2021/0296098 | A1* | 9/2021 | Cho | ................... | H01L 21/68735 |

FOREIGN PATENT DOCUMENTS

| JP | 2005-33062 A | 2/2005 |
| KR | 10-2018-0120091 A | 11/2018 |

* cited by examiner

*Primary Examiner* — Charlee J. C. Bennett
(74) *Attorney, Agent, or Firm* — XSENSUS LLP

(57) ABSTRACT

An apparatus for plasma processing comprises: a support configured to support a substrate and an edge ring disposed around the substrate; a lifting mechanism configured to vertically move the edge ring; and a controller. The support includes a convex portion which protrudes upward and on which the substrate is mounted, a ring mounting portion on which the edge ring is mounted in a state in which the convex portion is inserted into the hole of the edge ring, and a temperature adjustment mechanism configured to adjust a temperature of the convex portion. The lifting mechanism and the temperature adjustment mechanism are configured to move the edge ring to a predetermined position at which the convex portion is in a state of being inserted into the hole of the edge ring and heat the convex portion of the support to expand it in a diametric direction thereof.

19 Claims, 14 Drawing Sheets

APPARATUS FOR PLASMA PROCESSING AND PLASMA PROCESSING SYSTEM

CROSS-REFERENCE TO RELATED APPLICATION

This application claims priority to Japanese Patent Application No. 2020-189256 filed on Nov. 13, 2020, the entire contents of which are incorporated herein by reference.

TECHNICAL FIELD

The present disclosure relates to an apparatus for plasma processing and a plasma processing system.

BACKGROUND

In a plasma processing apparatus disclosed in Japanese Patent Application Publication No. 2005-033062, a focus ring is provided on an upper surface of a mounting table so as to surround a periphery of a semiconductor wafer. In addition, a positioning pin for positioning the entire focus ring at a predetermined position on the mounting table is provided on the mounting table, and a positioning hole corresponding to the positioning pin is formed in the focus ring.

SUMMARY

In a technique according to the present disclosure, an edge ring is precisely mounted on a support.

In accordance with an aspect of the present disclosure, there is provided an apparatus for plasma processing for performing plasma processing on a substrate, the apparatus comprising: a support configured to support a substrate and an edge ring disposed around the substrate; a lifting mechanism configured to vertically move the edge ring; and a controller, wherein: the edge ring has a hole that is concentric with the edge ring; the support includes a convex portion which protrudes upward and on which the substrate is mounted, a ring mounting portion on which the edge ring is mounted in a state in which the convex portion is inserted into the hole of the edge ring, and a temperature adjustment mechanism configured to adjust a temperature of the convex portion; the hole of the edge ring and the convex portion of the support have a shape corresponding to each other in a plan view; and the controller controls the lifting mechanism and the temperature adjustment mechanism to perform a process of moving the edge ring to a predetermined position at which the convex portion of the support is in a state of being inserted into the hole of the edge ring and a process of, after the process of the moving, heating the convex portion of the support to expand the convex portion of the support in a diametric direction thereof.

DETAILED DESCRIPTION

Figure 1:
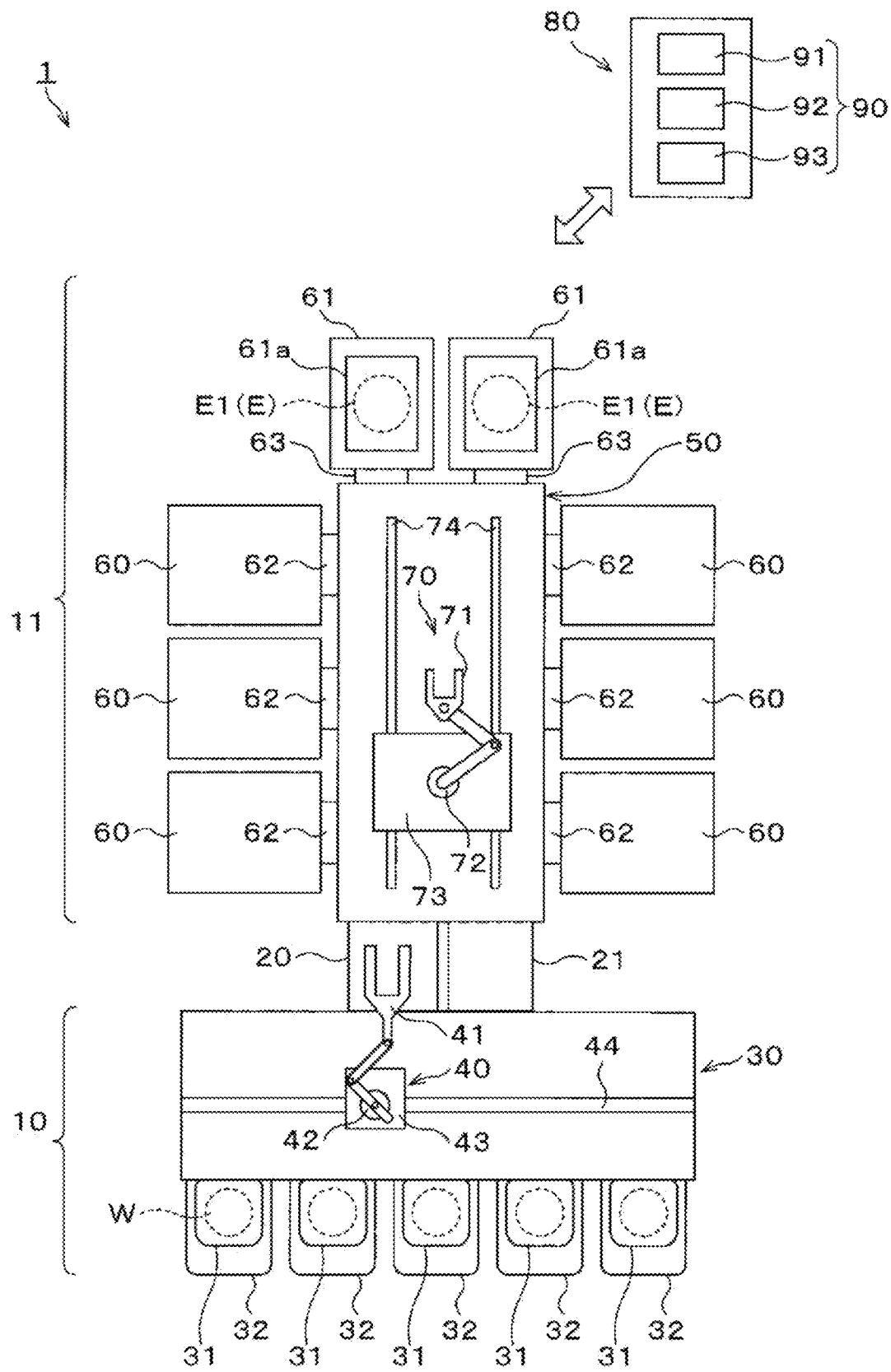
FIG. 1 is a plan view illustrating an outline of a configuration of a plasma processing system according to a first embodiment.

In a process of manufacturing a semiconductor device or the like, a substrate such as a semiconductor wafer (hereinafter, referred to as "wafer") is subjected to plasma processing such as etching by using a plasma. The plasma processing is performed in a state in which the substrate is mounted on a support in a depressurized processing container. In addition, in order to obtain an excellent and uniform plasma processing result at a central portion and a peripheral portion of the substrate, a member having a round ring shape in a plan view, which is referred to as a focus ring, an edge ring, or the like (hereinafter, referred to as "edge ring"), is mounted on the support so as to be disposed to surround a periphery of the substrate on the support. When the edge ring is used, in order to obtain a uniform processing result in a circumferential direction at the peripheral portion of the substrate, it is necessary to mount the edge ring at a desired position on the support. For example, in Japanese Patent Application Publication No. 2005-033062, by using a positioning hole formed in a focus ring and a positioning pin provided on a mounting table, the entire focus ring is positioned at a predetermined position on the mounting table.

However, when an edge ring is worn out, the edge ring is generally replaced by an operator. Meanwhile, replacing the edge ring using a transfer device for transferring the edge ring is also taken into account. In this case, the edge ring is mounted on a ring mounting portion of the support by the transfer device. For example, the transfer device supporting the edge ring is inserted into a processing chamber of an apparatus for plasma processing from the outside of the processing chamber, the edge ring is mounted on a lifting pin lifted upward from the ring mounting portion of the support, and then, the transfer device is drawn out of the processing chamber. Thereafter, the lifting pin is lowered, and the edge ring on the lifting pin is mounted on the ring mounting portion.

However, when the edge ring is replaced using the transfer device, in a configuration using the positioning hole and the positioning pin as described above, the edge ring cannot be positioned with respect to the support by the transfer device with precision that is greater than or equal to the transfer accuracy of the edge ring. This is because, when a difference between an inner diameter of the positioning hole and a diameter of the positioning pin is made to be less than the transfer accuracy for accurate positioning, the positioning pin cannot be inserted into the positioning hole and thus the edge ring cannot be properly mounted on the support. There is also a limit to the transfer accuracy of the edge ring by the transfer device.

Therefore, in a technique according to the present disclosure, an edge ring is precisely mounted on a support.

Hereinafter, an apparatus for plasma processing and a plasma processing system according to the present embodiment will be described with reference to the accompanying drawings. Moreover, in the present specification and the drawings, elements which have substantially the same function and configuration are assigned the same reference numerals, and overlapping descriptions thereof are omitted.

First Embodiment

<Plasma Processing System>

FIG. 1 is a plan view illustrating an outline of a configuration of a plasma processing system according to a first embodiment.

In a plasma processing system 1 of FIG. 1, a wafer W as a substrate is subjected to a plasma process such as an etching process.

As shown in FIG. 1, the plasma processing system 1 includes an atmospheric unit 10 and a decompression unit 11, and the atmospheric unit 10 and the decompression unit 11 are integrally connected through load lock modules 20 and 21. The atmospheric unit 10 includes an atmospheric module that performs a desired process on the wafer W in an atmospheric pressure atmosphere. The decompression unit 11 includes a processing module 60 that performs a desired process on the wafer W in a depressurized atmosphere (vacuum atmosphere). The load lock modules 20 and 21 are provided to connect a loader module 30 included in the atmospheric unit 10 and a transfer module 50 included in the decompression unit 11 through gate valves (not shown). The load lock modules 20 and 21 are configured to temporarily hold the wafer W. Furthermore, the load lock modules 20 and 21 are provided such that the inside thereof may be converted between an atmospheric pressure atmosphere and a reduced-pressure atmosphere.

The atmospheric unit 10 includes the loader module 30 provided with a transfer device 40 to be described below and a load port 32 on which a front opening unified pod (FOUP) 31 is mounted. The FOUP 31 may store a plurality of wafers W. In addition, the loader module 30 may be connected to an orientor (not shown) for adjusting a horizontal orientation of the wafer W, a buffer module (not shown) for temporarily storing the plurality of wafers W, and the like.

The loader module 30 includes a rectangular housing, and the inside of the housing is maintained in an atmospheric pressure atmosphere. A plurality of load ports 32, for example, five load ports 32 are provided side by side on one side surface forming a long side of the housing of the loader module 30. The load lock modules 20 and 21 are provided side by side on the other side surface forming a long side of the housing of the loader module 30.

The transfer device 40 for transferring the wafer W is provided inside the loader module 30. The transfer device 40 includes a transfer arm 41 which supports the wafer W, a rotary table 42 which rotatably supports the transfer arm 41, and a base 43 on which the rotary table 42 is mounted. In addition, a guide rail 44 extending in a longitudinal direction of the loader module 30 is provided inside the loader module 30. The base 43 is provided on the guide rail 44, and the transfer device 40 is provided to be movable along the guide rail 44.

The decompression unit 11 includes a transfer module 50 which transfers the wafer W and an edge ring E1, a processing module 60 as a plasma processing device which performs desired plasma processing on the wafer W transferred from the transfer module 50, and an accommodation module 61 as an accommodation part which accommodates the edge ring E1. The insides of the transfer module 50 and the processing module 60 (specifically, the insides of a decompression transfer chamber 51 and a plasma processing chamber 100 which will be described below) are each maintained in a reduced-pressure atmosphere, and the inside of the accommodation module 61 is also maintained in a reduced-pressure atmosphere. For one transfer module 50, a plurality of processing modules 60, for example, six processing modules 60, are provided, and a plurality of accommodation modules 61, for example, two accommodation modules 61, are also provided. The number and arrangement of the processing modules 60 are not limited to the present embodiment and may be arbitrarily set as long as at least one processing module required to replace the edge ring E1 is provided. In addition, the number and arrangement of the accommodation modules 61 are not limited to the present embodiment and may be arbitrarily set as long as at least one accommodation module 61 may be provided.

The transfer module 50 includes a decompression transfer chamber 51 which includes a housing having a polygonal shape (pentagonal shape in the illustrated example), and the decompression transfer chamber 51 is connected to the load lock modules 20 and 21. The transfer module 50 transfers the wafer W loaded into the load lock module 20 to one processing module 60 and carries the wafer W subjected to desired plasma processing in the processing module 60 out to the atmospheric unit 10 through the load lock module 21. In addition, the transfer module 50 transfers the edge ring E1 in the accommodation module 61 to one processing module 60 and carries the edge ring E1 to be replaced in the processing module 60 out to the accommodation module 61.

The processing module 60 performs plasma processing such as etching on the wafer W. In addition, the processing module 60 is connected to the transfer module 50 through a gate valve 62. The configuration of the processing module 60 will be described below.

The accommodation module 61 accommodates the edge ring E1, and specifically, the accommodation module 61 accommodates the edge ring E1 and a ring set E in which the edge ring E1 and a cover ring E2 described below are integrated. Furthermore, the accommodation module 61 is connected to the transfer module 50 through a gate valve 63. The accommodation module 61 is provided with a heating device 61*a* for heating the edge ring E1. The heating device 61*a* includes, for example, a light-emitting element and uses light from the light-emitting element to heat the edge ring E1. A heating method of the heating device 61*a* is not limited to the above-described method and may be a method using a high-temperature gas or the like.

A transfer device 70 for transferring the wafer W and the edge ring E1 (specifically, the ring set E) is provided inside the decompression transfer chamber 51 of the transfer module 50. Similar to the transfer device 40, the transfer device 70 includes a transfer arm 71 which supports the wafer W and the ring set E during a transfer thereof, a rotary table 72 which rotatably supports the transfer arm 71, and a base 73 on which the rotary table 72 is mounted. In addition, a guide rail 74 extending in a longitudinal direction of the transfer module 50 is provided inside the transfer module 50. The base 73 is provided on the guide rail 74, and the transfer device 70 is provided to be movable along the guide rail 74.

In the transfer module 50, the transfer arm 71 receives the wafer W held in the load lock module 20 and carries the water W into the processing module 60. In addition, the transfer arm 71 receives the wafer W held in the processing module 60 and carries wafer W out to the load lock module 21.

Furthermore, in the transfer module 50, the transfer arm 71 receives the edge ring E1 (specifically, the ring set E) in the accommodation module 61 and carries the edge ring E1 into the processing module 60. In addition, the transfer arm 71 receives the edge ring E1 (specifically, the ring set E) held in the processing module 60 and carries the edge ring E1 out to the accommodation module 61.

Furthermore, the plasma processing system 1 includes a control device 80. In one embodiment, the control device 80 processes computer-executable instructions that cause the plasma processing system 1 to perform various processes described in the present disclosure. The control device 80 may be configured to control each of other elements of the plasma processing system 1 to perform the various processes described herein. In one embodiment, a part or entirety of the control device 80 may be included in other elements of the plasma processing system 1. The control device 80 may include, for example, a computer 90. The computer 90 may include, for example, a central processing unit (CPU) 91, a memory 92, and a communication interface 93. The CPU 91 may be configured to perform various control operations based on programs stored in the memory 92. The memory 92 may include a random access memory (RAM), a read only memory (ROM), a hard disk drive (HDD), a solid state drive (SSD), or a combination thereof. The communication interface 93 may perform communication with other elements of the plasma processing system 1 through a communication line such as a local area network (LAN) or the like.

In addition, the control device 80 also serves as a controller for the processing module 60 as an apparatus for plasma processing.

<Wafer Processing of Plasma Processing System 1>

Next, wafer processing performed using the plasma processing system 1 configured as described above will be described.

First, the transfer device 40 carries the wafer W out of the desired FOUP 31 and carries the wafer W into the load lock module 20. After that, the inside of the load lock module 20 is sealed and depressurized. After that, the inside of the load lock module 20 communicates with the inside of the transfer module 50.

Next, the wafer W is held by the transfer device 70 and transferred from the load lock module 20 to the transfer module 50.

Thereafter, the gate valve 62 is opened, and the wafer W is loaded into the desired processing module 60 by the transfer device 70. After that, the gate valve 62 is closed, and the wafer W is subjected to desired processing in the processing module 60. The processing performed on the wafer W in the processing module 60 will be described below.

Next, the gate valve 62 is opened, and the wafer W is unloaded from the processing module 60 by the transfer device 70. After that, the gate valve 62 is closed.

Next, the wafer W is loaded into the load lock module 21 by the transfer device 70. When the wafer W is loaded into the load lock module 21, the inside of the load lock module 21 is sealed and opened to the atmosphere. After that, the inside of the load lock module 21 communicates with the inside of the loader module 30.

Then, the transfer device 40 holds the wafer W and returns the wafer W from the load lock module 21 to the desired FOUP 31 through the loader module 30 so as to be accommodated. Therefore, a series of processes for processing the wafer in the plasma processing system is ended.

<Processing Module 60>

Figure 2:
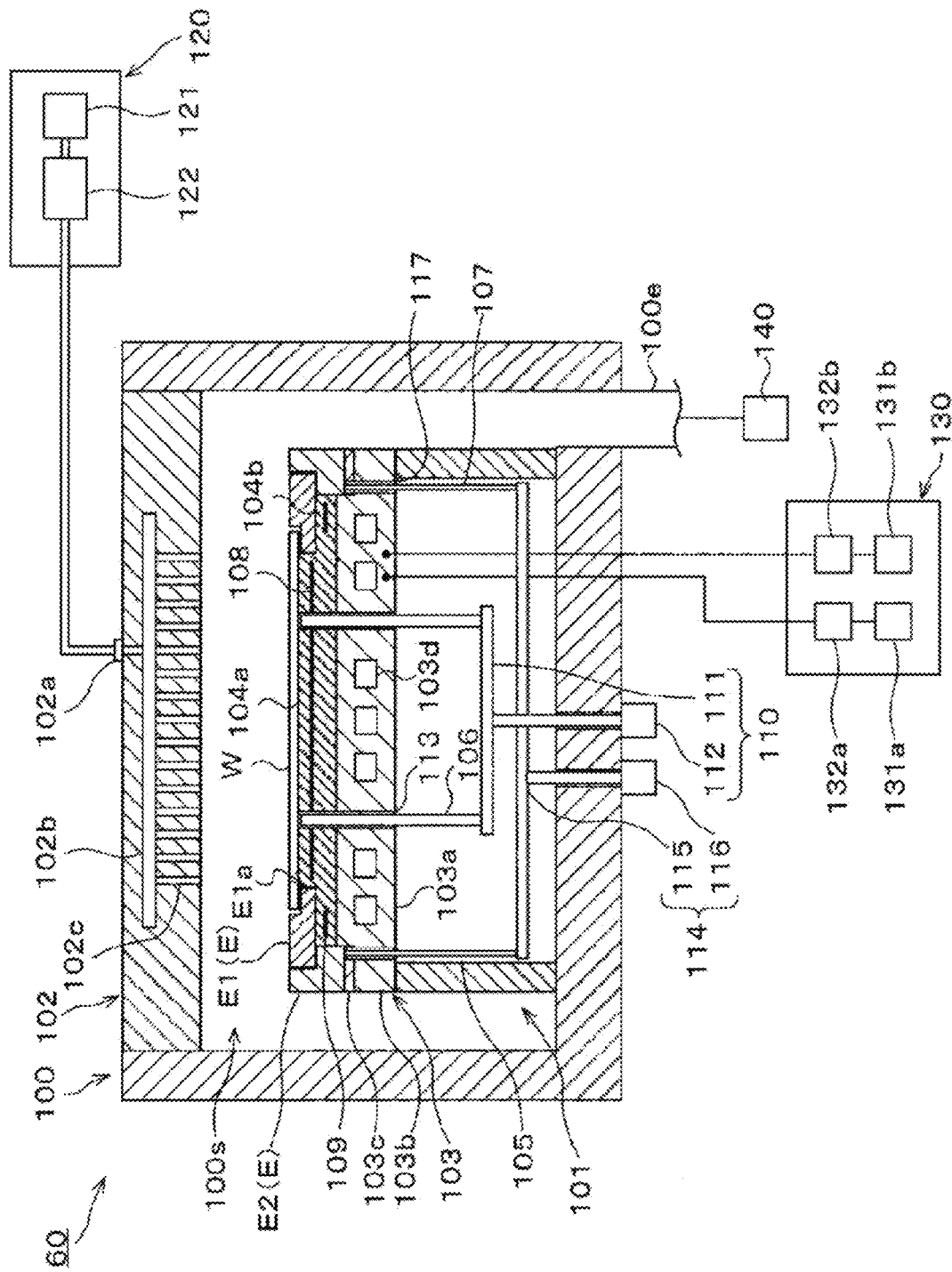
FIG. 2 is a longitudinal cross-sectional view illustrating an outline of a configuration of a processing module.
Figure 3:
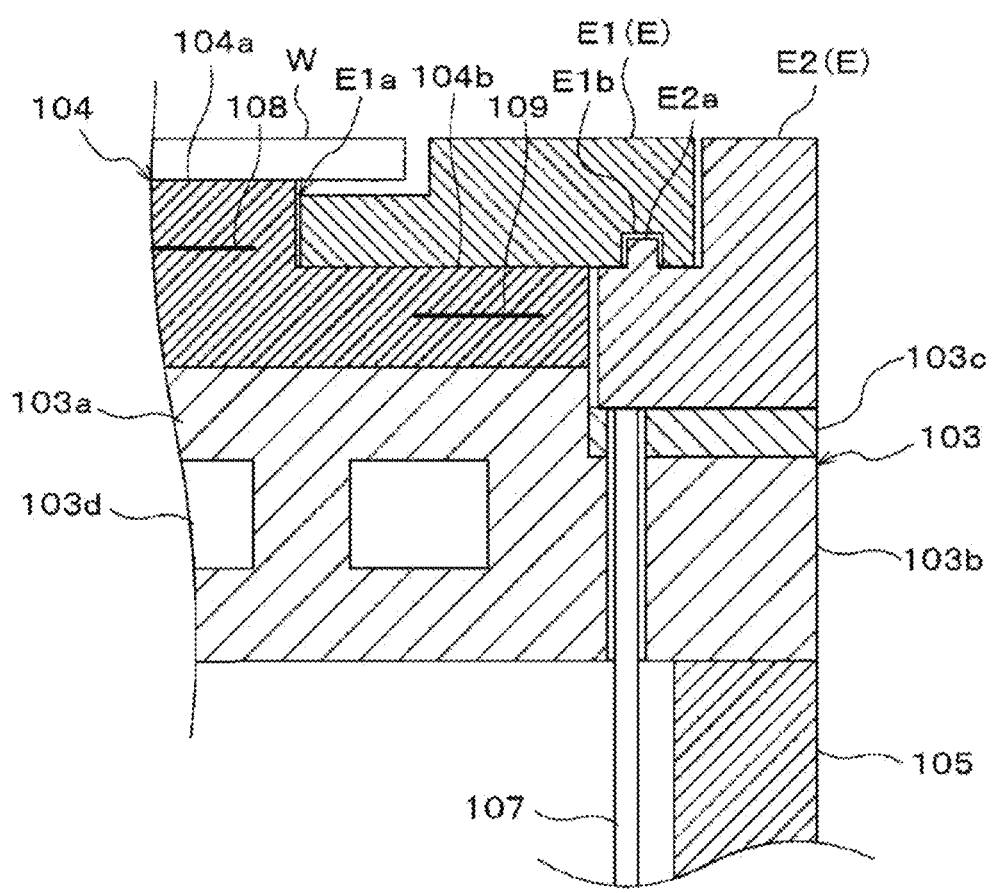
FIG. 3 is a partially enlarged view of FIG. 2.

Next, the processing module 60 will be described with reference to FIGS. 2 and 3. FIG. 2 is a longitudinal cross-sectional view illustrating an outline of a configuration of the processing module 60. FIG. 3 is a partially enlarged view of FIG. 2.

As shown in FIG. 2, the processing module 60 includes the plasma processing chamber 100 as a processing container, a gas supply 120, a radio frequency (RF) power supply 130, and an exhaust system 140. In addition, the processing module 60 includes a wafer support 101 as a support and an upper electrode 102.

The wafer support 101 is disposed in a lower region of a plasma processing space 100s in the plasma processing chamber 100 capable of being depressurized. The upper electrode 102 is positioned above the wafer support 101 and may function as a part of a ceiling of the plasma processing chamber 100.

The wafer support 101 is configured to support the wafer W and the edge ring E1 (specifically, the ring set E) in the plasma processing space 100s. In one embodiment, the wafer support 101 includes a base 103, an electrostatic chuck 104, a leg portion 105, a lifting pin 106, and a lifting pin 107.

The base 103 has a function as a lower electrode. Furthermore, the electrostatic chuck 104 is fixed to the base 103, and the base 103 supports an insulating ring 103c. For example, the base 103 is made of a conductive metal such as aluminum.

The base 103 includes a fixing portion 103a, to which the electrostatic chuck 104 is fixed, at a central portion thereof, and a mounting portion 103b, on which the insulating ring 103c supporting the cover ring E2 is mounted, at a peripheral portion thereof. An upper surface of the fixing portion 103a is at a higher level than an upper surface of the mounting portion 103b. In the present embodiment, the base 103 is formed by integrating the fixing portion 103a and the mounting portion 103b.

In addition, a flow path 103d for a temperature adjustment fluid as a temperature adjustment is formed inside the base 103 (specifically, inside the fixing portion 103a). The temperature adjustment fluid is supplied from a chiller (not shown) provided outside the plasma processing chamber 100. The temperature adjustment fluid supplied to the flow path 103d returns to the chiller. By circulating, for example, low-temperature brine as the temperature adjustment fluid in the flow path 103d, for example, the wafer support 101, the wafer W, and the edge ring E1 mounted on the wafer support 101 may be cooled to a predetermined temperature. By circulating, for example, high-temperature brine as the temperature adjustment fluid in the flow path 103d, the wafer support 101, the wafer W, and the edge ring E1 mounted on the wafer support 101, for example, may be heated to a predetermined temperature.

The fixing portion 103a is formed in a cylindrical shape and has substantially the same diameter as a ring mounting portion 104b to be described below of the electrostatic chuck 104.

The mounting portion 103b is formed in a round ring plate shape.

The insulating ring 103c is a member having a round ring shape in a plan view and is made of a material having a high heat insulating property and a high electrical insulating property. An inner diameter of the insulating ring 103c is slightly greater than a diameter of the fixing portion 103a of the base 103, and an outer diameter of the insulating ring 103c is substantially the same as an outer diameter of the mounting portion 103b of the base 103.

The insulating ring 103c supports the cover ring E2 when the ring set E in which the edge ring E1 and the cover ring E2 are integrated is mounted on the wafer support 101.

Both of the edge ring E1 and the cover ring E2 are members having a round ring shape in a plan view.

The edge ring E1 is disposed to surround the wafer W mounted on the electrostatic chuck 104. Since the edge ring E1 has the round ring shape in a plan view, the edge ring E1 has a circular hole E1a that is concentric with the edge ring E1. As a material of the edge ring E1, for example, conductive silicon (Si) or silicon carbide (SiC) is used.

An inner diameter of the edge ring E1 is formed to be slightly greater than an outer diameter of a wafer mounting portion 104a of the electrostatic chuck 104 to be described below by, for example, 0.3 mm to 0.8 mm.

The cover ring E2 covers an outer side surface of the edge ring E1 and is integrated with the edge ring E1 when the edge ring E1 is transferred and elevated, thereby constituting the ring set E. As a material of the cover ring E2, for example, a material having a high heat insulating property and a high electrical insulating property is used.

An outer diameter of the cover ring E2 is greater than an outer diameter of the edge ring E1, and an inner diameter thereof is greater than the inner diameter of the edge ring E1 and is less than the outer diameter of the edge ring E1. In addition, the inner diameter of the cover ring E2 is formed to be slightly greater than an outer diameter of the ring mounting portion 104b to be described below of the electrostatic chuck 104 and an outer diameter of the fixing portion 103a of the base 103. A difference between the inner diameter of the cover ring E2 and the outer diameter of the ring mounting portion 104b is greater than a difference between the inner diameter of the edge ring E1 and the outer diameter of the wafer mounting portion 104a, and when the electrostatic chuck 104 expands, the electrostatic chuck 104 first comes into contact with the edge ring E1 instead of the cover ring E2 and does not come into contact with the cover ring E2.

In a state of the ring set E, that is, in a state in which the cover ring E2 is integrated with the edge ring E1, the cover ring E2 partially overlaps the edge ring E1 in a plan view and supports the edge ring E1 from below.

As shown in FIG. 3, a ring-shaped protrusion E2a concentric with the cover ring E2 is formed on an upper surface of the cover ring E2. Furthermore, in the edge ring E1, at a position corresponding to the ring-shaped protrusion E2a, a ring-shaped recess E1b concentric with the edge ring E1 is formed to be engaged with the ring-shaped protrusion E2a. Since the ring-shaped protrusion E2a and the ring-shaped recess E1b are engaged with each other, for example, during plasma processing, it is possible to prevent radicals from penetrating to the wafer W through a gap between the edge ring E1 and the cover ring E2.

The electrostatic chuck 104 is provided on the fixing portion 103a of the base 103 and adsorbs and holds both the wafer W and the edge ring E1 with an electrostatic force.

The electrostatic chuck 104 includes the wafer mounting portion 104a, on which the wafer W is mounted, at a central portion thereof and the ring mounting portion 104b, on which the edge ring E1 is mounted, at a peripheral portion thereof. An upper surface of the wafer mounting portion 104a is at a higher level than an upper surface of the ring mounting portion 104b.

In other words, the electrostatic chuck 104 includes a convex portion (corresponding to an upper portion of the wafer mounting portion 104a) protruding upward, on which the wafer W is mounted, and the ring mounting portion 104b provided around the convex portion. The edge ring E1 is mounted on the ring mounting portion 104b in a state in which the convex portion (that is, the upper portion of the wafer mounting portion 104a) is inserted into the hole E1a of the edge ring E1.

The convex portion of the electrostatic chuck 104 (that is, the upper portion of the wafer mounting portion 104a) and the hole E1a of the edge ring E1 have a shape corresponding to each other in a plan view. In the present embodiment, since the hole E1a of the edge ring E1 has a circular shape as described above, the convex portion of the electrostatic chuck 104 (that is, the upper portion of the wafer mounting portion 104a) has, for example, a circular shape in a plan view.

The wafer mounting portion 104a of the electrostatic chuck 104 is provided with an electrode 108 for holding the wafer W through electrostatic adsorption, and the ring mounting portion 104b is provided with an electrode 109 for holding the edge ring E1 through electrostatic adsorption. The wafer mounting portion 104a and the ring mounting portion 104b have a configuration in which the electrodes 108 and 109 are interposed between insulators made of an insulating material.

A direct current (DC) voltage is applied from a DC power source (not shown) to the electrode 108. Due to an electrostatic force generated by the DC voltage, the wafer W is adsorbed and held by the wafer mounting portion 104a. Similarly, a DC voltage is applied from the DC power source (not shown) to the electrode 109. Due to an electrostatic force generated by the DC voltage, the edge ring E1 is adsorbed and held by the ring mounting portion 104b.

In addition, the wafer mounting portion 104a is formed, for example, in a cylindrical shape having a diameter that is less than a diameter of the wafer W, and when the wafer W is mounted on the wafer mounting portion 104a, a peripheral portion of the wafer W protrudes from the wafer mounting portion 104a.

A stepped portion is formed at an upper portion of the edge ring E1, and an upper surface of an outer peripheral portion of the edge ring E1 is formed at a higher level than an upper surface of an inner peripheral portion thereof. The inner peripheral portion of the edge ring E1 is formed to protrude under the peripheral portion of the wafer W protruding from the wafer mounting portion 104a. That is, the inner diameter of the edge ring E1 is formed to be less than an outer diameter of the wafer W.

The ring mounting portion 104b is formed, for example, in a round ring plate shape, and the outer diameter thereof is greater than the inner diameter of the edge ring E1 and is less than the outer diameter of the edge ring E1. When the edge ring E1 is mounted on the ring mounting portion 104b, a peripheral portion of the edge ring E1 protrudes from the ring mounting portion 104b.

A stepped portion is formed at an upper portion of the cover ring E2, and an upper surface of an outer peripheral portion of the cover ring E2 is formed at a higher level than an upper surface of an inner peripheral portion thereof. The inner peripheral portion of the cover ring E2 is formed to protrude under the peripheral portion of the edge ring E1 protruding from the ring mounting portion 104b.

Although not shown, a gas supply hole is formed in the wafer mounting portion 104a to supply a heat transfer gas to a rear surface of the wafer W mounted on the wafer mounting portion 104a, and similarly, a gas supply hole is formed in the ring mounting portion 104b to supply a heat transfer gas to a rear surface of the edge ring E1 mounted on the ring mounting portion 104b. A heat transfer gas from a gas supply (not shown) is supplied from the gas supply holes. The gas supply may include one or more gas sources and one or more pressure controllers. In one embodiment, the gas supply is configured to, for example, supply the heat transfer gas from the gas source to a heat transfer gas supply hole through the pressure controller.

In the present embodiment, the wafer mounting portion 104a and the ring mounting portion 104b are integrally formed in the electrostatic chuck 104.

The leg portion 105 is a cylindrical member made of an insulating material such as a ceramic and supports the base 103. For example, the leg portion 105 is formed to have an outer diameter that is the same as an outer diameter of the base 103 and supports a peripheral portion of the base 103. As shown in FIG. 2, the lifting pin 106 is a columnar member that is elevated to pass through the upper surface of the wafer mounting portion 104a of the electrostatic chuck 104 and is made of, for example, a ceramic. Three or more lifting pins 106 are provided at intervals in a circumferential direction of the electrostatic chuck 104, specifically, a circumferential direction of the upper surface of the wafer mounting portion 104a. The lifting pins 106 are provided, for example, at equal intervals in the circumferential direction. The lifting pin 106 is provided to vertically extend.

The lifting pin 106 is connected to a pin lifting mechanism 110 that elevates the lifting pin 106. For example, the pin lifting mechanism 110 includes a support member 111 which supports the plurality of lifting pins 106 and a driver 112 which generates a driving force for elevating the support member 111 to elevate the plurality of lifting pins 106. The driver 112 includes a driving assembly or driving mechanism (for example, an actuator, a motor, and/or other devices) which generates the driving force.

The lifting pin 106 is inserted into a through-hole 113 extending in a downward direction from the upper surface of the wafer mounting portion 104a of the electrostatic chuck 104 to a bottom surface of the base 103. In other words, the through-hole 113 is formed to pass through the wafer mounting portion 104a of the electrostatic chuck 104 and the base 103. An upper end surface of the lifting pin 106 supports the rear surface of the wafer W when the lifting pin 106 is lifted.

The lifting pin 107 is a columnar member that is elevated to pass through the upper surface of the ring mounting portion 104b of the electrostatic chuck 104 and is made of, for example, alumina, quartz, SUS, or the like. Three or more lifting pins 107 are provided at intervals in the circumferential direction of the electrostatic chuck 104, specifically, a circumferential direction of the upper surface of the ring mounting portion 104b. The lifting pins 107 are provided, for example, at equal intervals in the circumferential direction. The lifting pin 107 is provided to vertically extend.

The lifting pin 107 is connected to a pin lifting mechanism 114 which drives the lifting pin 107. For example, the pin lifting mechanism 114 includes a support member 115 which supports the plurality of lifting pins 107 and a driver 116 which generates a driving force for elevating the support member 115 to elevate the plurality of lifting pins 107. The driver 116 includes a driving assembly or a driving mechanism (for example, an actuator, a motor, and/or other devices) which generates the driving force.

The lifting pin 107 is inserted into a through-hole 117 extending in a downward direction from an upper surface of the insulating ring 103c mounted on the mounting portion 103b of the base 103 to the bottom surface of the base 103, and in other words, the through-hole 117 is formed to pass through the insulating ring 103c and the mounting portion 103b of the base 103.

The lifting pin 107 is a transfer member which supports and elevates the edge ring E1 (specifically, the ring set E) so as to transfer the edge ring E1 (specifically, the ring set E) between the processing module 60 and the transfer module 50. An upper end surface of the lifting pin 107 is formed to support a lower surface of the cover ring E2 of the ring set E.

In addition, the lifting pin 107 and the pin lifting mechanism 114 constitute a lifting mechanism which vertically moves the edge ring E1 (specifically, the ring set E), that is, elevates the edge ring E1.

The upper electrode 102 also functions as a shower head which supplies one or more processing gases from the gas supply 120 to the plasma processing space 100s. In one embodiment, the upper electrode 102 includes a gas inlet 102a, a gas diffusion chamber 102b, and a plurality of gas outlets 102c. For example, the gas inlet 102a fluidly communicates with the gas supply 120 and the gas diffusion chamber 102b. The plurality of gas outlets 102c fluidly communicate with the gas diffusion chamber 102b and the plasma processing space 100s. In one embodiment, the upper electrode 102 is configured to supply one or more processing gases from the gas inlet 102a to the plasma processing space 100s through the gas diffusion chamber 102b and the plurality of gas outlets 102c.

The gas supply 120 may include one or more gas sources 121 and one or more flow controllers 122. In one embodiment, the gas supply 120 is configured to, for example, supply one or more processing gases from each corresponding gas source 121 to the gas inlet 102a through the corresponding flow controller 122. Each flow controller 122 may include, for example, a mass flow controller or a pressure control type flow controller. Furthermore, the gas supply 120 may include one or more flow rate modulation devices which modulate or pulse a flow rate of one or more processing gases.

The RF power supply 130 is configured to supply RF power, for example, one or more RF signals, to one or more electrodes such as the base 103 as the lower electrode, the upper electrode 102, or both the base 103 as the lower electrode and the upper electrode 102. As a result, plasma is generated from one or more processing gases supplied to the plasma processing space 100s. Therefore, the RF power supply 130 may function as at least a part of a plasma generator configured to generate plasma from one or more processing gases in the plasma processing chamber. The RF power supply 130 includes, for example, two RF generators 131*a* and 131*b* and two matching circuits 132*a* and 132*b*. In one embodiment, the RF power supply 130 is configured to supply a first RF signal from a first RF generator 131*a* to the base 103 as the lower electrode through a first matching circuit 132*a*. For example, the first RF signal may have a frequency in a range of 27 MHz to 100 MHz.

In addition, in one embodiment, the RF power supply 130 is configured to supply a second RF signal from the second RF generator 131*b* to the base 103 as the lower electrode through the second matching circuit 132*b*. For example, the second RF signal may have a frequency in a range of 400 kHz to 13.56 MHz. A DC pulse generator may be used instead of the second RF generator 131*b*.

In addition, although not shown, other embodiments can be conceived in the present disclosure. For example, in an alternative embodiment, the RF power supply 130 may be configured to supply the first RF signal from an RF generator to the base 103 as the lower electrode, supply the second RF signal from another RF generator to the base 103 as the lower electrode, and supply a third RF signal from still another RF generator to the base 103 as the lower electrode. In addition, in another alternative embodiment, a DC voltage may be applied to the upper electrode 102.

Furthermore, in various embodiments, an amplitude of one or more RF signals (that is, the first RF signal, the second RF signal, and the like) may be pulsed or modulated. The modulation of the amplitude may include pulsing an amplitude of the RF signal between an on-state and an off-state or between two or more different on-states.

The exhaust system 140 may be connected to, for example, an exhaust port 100*e* provided in a bottom of the plasma processing chamber 100. The exhaust system 140 may include a pressure valve and a vacuum pump. The vacuum pump may include a turbo molecular pump, a roughing pump, or a combination thereof.

<Wafer Processing of Processing Module 60>

Next, an example of wafer processing performed using the processing module 60 will be described. In the processing module 60, the wafer W is subjected to, for example, etching processing, film forming processing, or the like.

First, the wafer W is loaded into the plasma processing chamber 100 and is lifted by the lifting pin 106 and mounted on the electrostatic chuck 104. After that, a DC voltage is applied to the electrode 108 of the electrostatic chuck 104, and, thus, the wafer W is electrostatically adsorbed and held by the electrostatic chuck 104 by an electrostatic force. In addition, after the wafer W is loaded into the plasma processing chamber 100, the inside of the plasma processing chamber 100 is depressurized to a predetermined degree of vacuum by the exhaust system 140.

Next, a processing gas is supplied from the gas supply 120 to the plasma processing space 100*s* through the upper electrode 102. Further, high-frequency power HF for plasma generation is supplied from the RF power supply 130 to the base 103 that is the lower electrode, thereby exciting the processing gas to generate plasma. In this case, high-frequency power LF for ion attraction may be supplied from the RF power supply 130. The wafer W is subjected to plasma processing by an action of the generated plasma.

When the plasma processing is ended, the supply of the high-frequency power HF from the RF power supply 130 and the supply of the processing gas from the gas supply 120 are stopped. In a case the high-frequency power LF was being supplied during the plasma processing, the supply of the high-frequency power LF is also stopped. Next, the application of the DC voltage to the electrode 108 is stopped, and the adsorbing and holding of the wafer W by the electrostatic chuck 104 are stopped.

After that, the wafer W is lifted by the lifting pin 106, and the wafer W is separated from the electrostatic chuck 104. At the time of the separation, a static elimination process may be performed on the wafer W. The wafer W is unloaded from the plasma processing chamber 100, and a series of processes for processing the wafer is ended.

Example 1 of Installation Process

Next, as an installation process of the edge ring E1 in the processing module 60, which is performed using the plasma processing system 1, an example of a process including a process of aligning a position of the edge ring E1 with the wafer support 101 will be described with reference to FIGS. 4 to 8. FIGS. 4 to 8 are schematic views illustrating the surroundings of the wafer support 101 during an installation process of the present example. In the following drawings, a case in which each member is expanded due to heating is indicated by a rightward black arrow, and a state in which each member is contracted due to cooling is indicated by a leftward white arrow.

In the process of aligning the position, specifically, centering is performed to bring a central axis of the wafer mounting portion 104*a* of the electrostatic chuck 104 closer to a central axis of the edge ring E1. The following processes are performed in a vacuum atmosphere under control of the control device 80.

(Step S1: Transfer of Edge Ring E1)

First, the edge ring E1 accommodated in the accommodation module 61 is transferred to the processing module 60 which is an installation target in which the edge ring E1 is to be installed.

Specifically, the ring set E in the accommodation module 61 is held by the transfer arm 71 of the transfer device 70. Next, the transfer arm 71 holding the ring set E is inserted into the depressurized plasma processing chamber 100 of the processing module 60, which is the installation target, through a carry-in outlet (not shown). The ring set E held by the transfer arm 71 is transferred above the ring mounting portion 104*b* positioned at the peripheral portion of the electrostatic chuck 104. Next, the lifting pin 107 is lifted, and the ring set E is transferred from the transfer arm 71 to the lifting pin 107. After that, the transfer arm 71 is drawn out of the plasma processing chamber 100, that is, the transfer arm 71 is retracted.

(Step S2: Lowering of Edge Ring E1)

Figure 4:
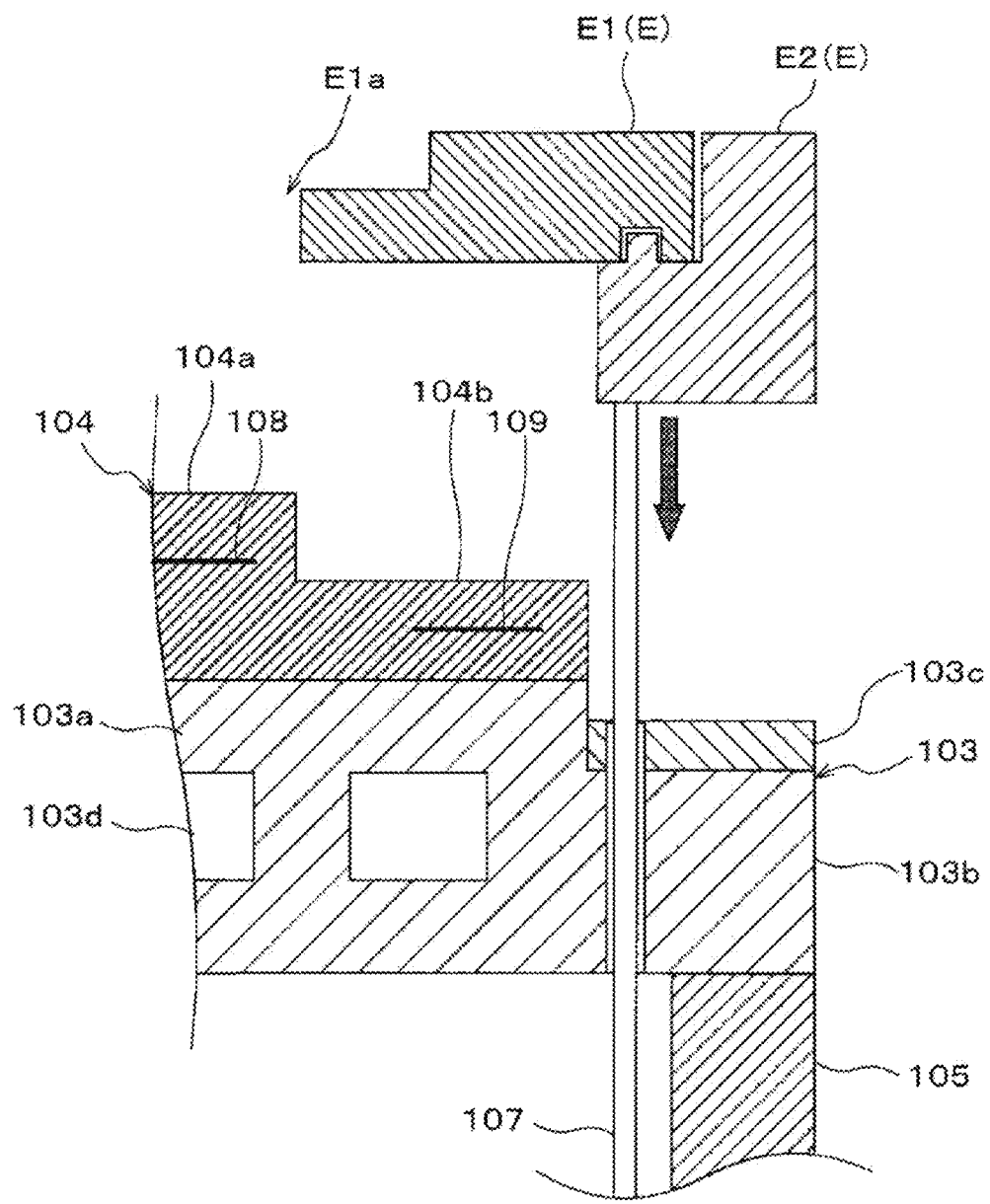
FIG. 4 is a schematic view illustrating the surroundings of a wafer support during an installation process of Example 1.

Subsequently, as shown in FIG. 4, the edge ring E1 is lowered such that the convex portion of the wafer support 101 (that is, the upper portion of the wafer mounting portion 104*a*) is inserted into the hole E1*a* of the edge ring E1.

Specifically, the lifting pin 107 receiving the ring set E from the transfer arm 71 is lowered.

(Step S3: Movement of Edge Ring E1 to Predetermined Position)

Figure 5:
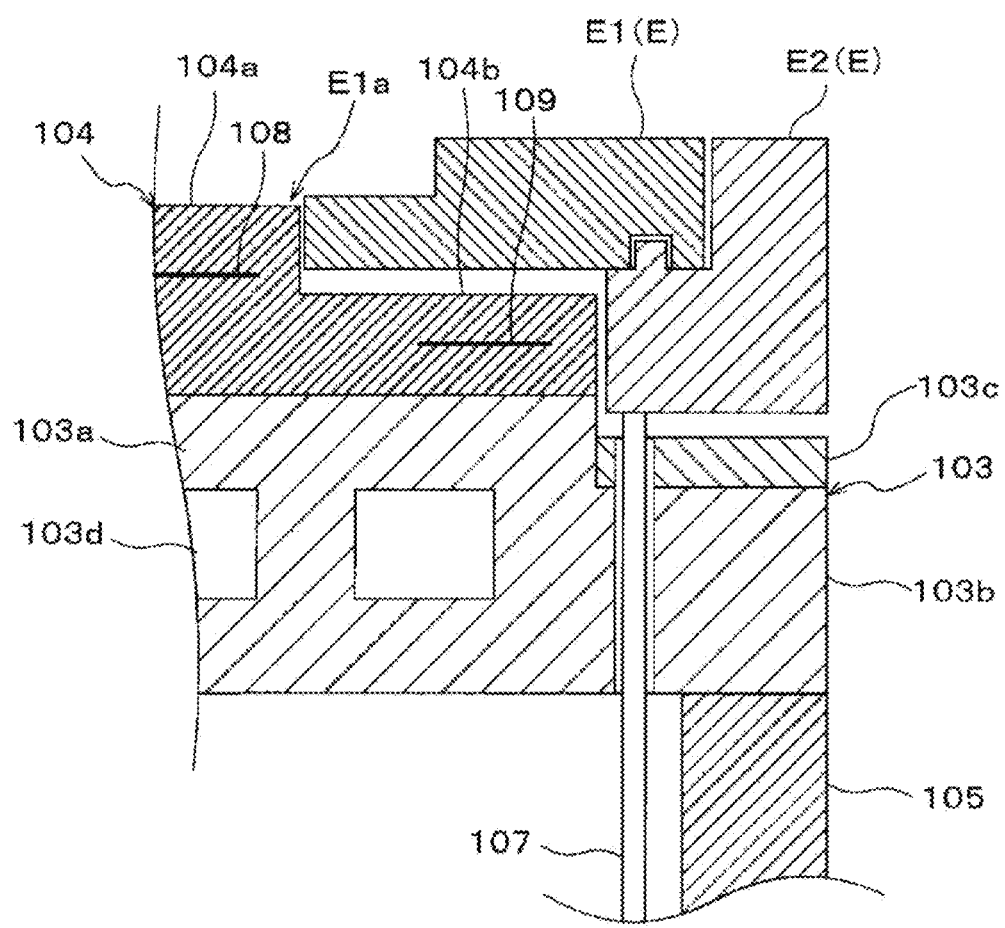
FIG. 5 is a schematic view illustrating the surroundings of the wafer support during the installation process of Example 1.

Next, as shown in FIG. 5, the edge ring E1 is moved to a predetermined position at which the convex portion of the wafer support 101 (that is, the upper portion of the wafer mounting portion 104*a*) is in a state of being inserted into the hole E1*a* of the edge ring E1.

Specifically, for example, the lifting pin 107 receiving the ring set E from the transfer arm 71 is lowered until a position of the edge ring E1 becomes the predetermined position. The predetermined position is, for example, is a position at which the edge ring E1 is separated upward from the upper surface of the ring mounting portion 104*b* in a state in which the convex portion of the wafer support 101 (that is, the upper portion of the wafer mounting portion 104a) is inserted into the hole E1a of the edge ring E1. A distance from a bottom surface of the edge ring E1 to the ring mounting portion 104b at the predetermined position may be, for example, in a range of 0.3 mm to 1 mm as long as the edge ring E1 and the ring mounting portion 104b are vacuum-insulated from each other.

Furthermore, from step S1 to step S3, a temperature of the edge ring E1 and the electrostatic chuck 104 is room temperature (for example, 25° C.).

(Step S4: Expansion of Convex Portion)

Figure 6:
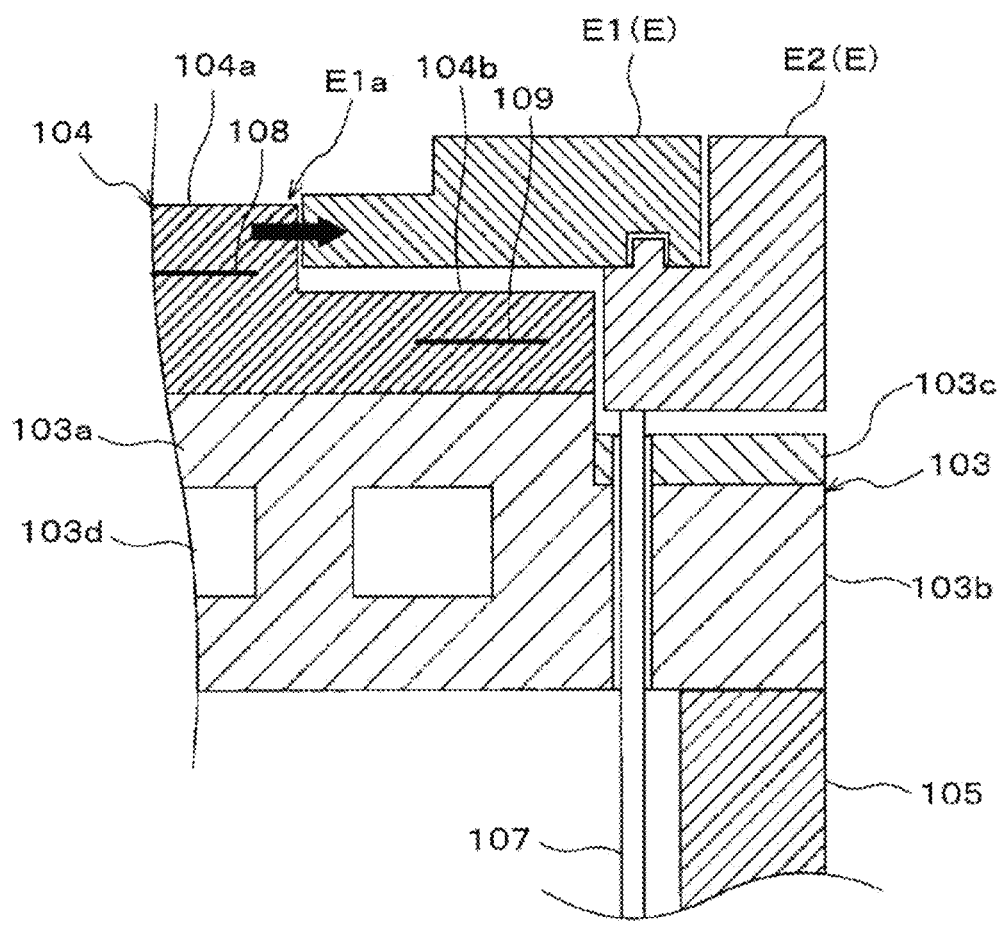
FIG. 6 is a schematic view illustrating the surroundings of the wafer support during the installation process of Example 1.

After step S3, as shown in FIG. 6, the convex portion of the wafer support 101 (that is, the upper portion of the wafer mounting portion 104a) is heated to be expanded. When the edge ring E1 is eccentric with respect to the wafer mounting portion 104a when the convex portion is expanded as described above, the convex portion comes into contact with the edge ring E1 at the predetermined position. If the convex portion continues to be expanded after that, the central axis of the wafer mounting portion 104a of the electrostatic chuck 104 and the central axis of the edge ring E1 approach each other as the convex portion is being expanded.

More specifically, a high-temperature fluid is allowed to flow through the flow path 103d of the base 103 to heat the entire wafer support 101 including the wafer mounting portion 104a of the electrostatic chuck 104, thereby expanding the wafer mounting portion 104a. In this case, even when the entire wafer support 101 is heated, since the edge ring E1 is positioned at the predetermined position, the edge ring E1 is separated from the ring mounting portion 104b and thus is not heated. When the edge ring E1 is eccentric with respect to the wafer mounting portion 104a when the convex portion is expanded as described above, the wafer mounting portion 104a (specifically, a side surface thereof) comes into contact with an inner peripheral surface forming the hole E1a in the edge ring E1 at the predetermined position. Even after the contact, a high-temperature fluid is allowed to continuously flow through the flow path 103d of the base 103 to heat and expand the wafer mounting portion 104a so that the edge ring E1 is pushed by the wafer mounting portion 104a and moved above the cover ring E2. As a result, the central axis of the wafer mounting portion 104a of the electrostatic chuck 104 and the central axis of the edge ring E1 approach each other.

Such a process is ended, for example, when a predetermined time has elapsed after a high-temperature fluid has started to flow.

In the process, the wafer mounting portion 104a is heated to, for example, 100° C. or higher. When the wafer mounting portion 104a cannot be sufficiently heated only by allowing a high-temperature fluid to flow through the flow path 103d and thus cannot be sufficiently expanded, in addition to or instead of the flow path 103d, a separate heating mechanism having a higher heating capacity may be provided. The separate heating mechanism is, for example, a resistance heater, and is provided in, for example, the electrostatic chuck 104.

(Step S5: Contraction of Convex Portion).

Figure 7:
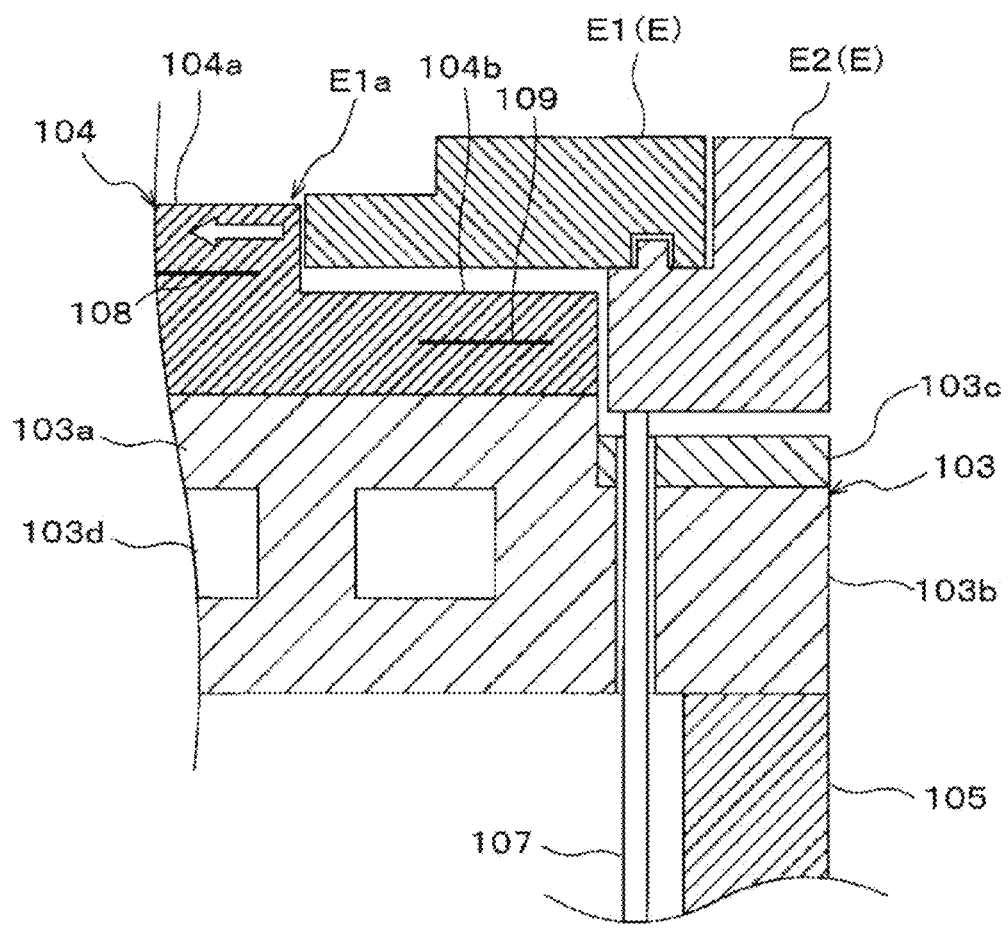
FIG. 7 is a schematic view illustrating the surroundings of the wafer support during the installation process of Example 1.

After the expansion process in step S4, as shown in FIG. 7, the heating of the convex portion of the wafer support 101 (that is, the upper portion of the wafer mounting portion 104a) is stopped, and the convex portion is cooled to be contracted in a diametric direction thereof.

Specifically, the flow of the high-temperature fluid through the flow path 103d of the base 103 is stopped, and the wafer mounting portion 104a is cooled to, for example, room temperature so that it is contracted in the diametric direction. As a result, even when the convex portion of the wafer support 101 (that is, the upper portion of the wafer mounting portion 104a) comes into contact with the edge ring E1 in step S4, a gap (clearance) may be formed between the convex portion and the edge ring E1. Therefore, when the edge ring E1 is lowered in a subsequent process, it is possible to prevent the edge ring E1 from being displaced or particles from being generated due to the centered edge ring E1 rubbing against the convex portion. Such a process may be omitted. In addition, when the process is omitted, at least one of a side surface of the convex portion (that is, a side surface of the upper portion of the wafer mounting portion 104a) and the inner peripheral surface of the edge ring E1 may be covered with a lubricating material in advance.

Furthermore, when the convex portion of the wafer support 101 is cooled in the present process, a low-temperature fluid may be allowed to flow through the flow path 103d of the base 103. As a result, the wafer mounting portion 104a can be cooled to a desired temperature in a short time.

(Step S6: Mounting of Edge Ring E1)

Figure 8:
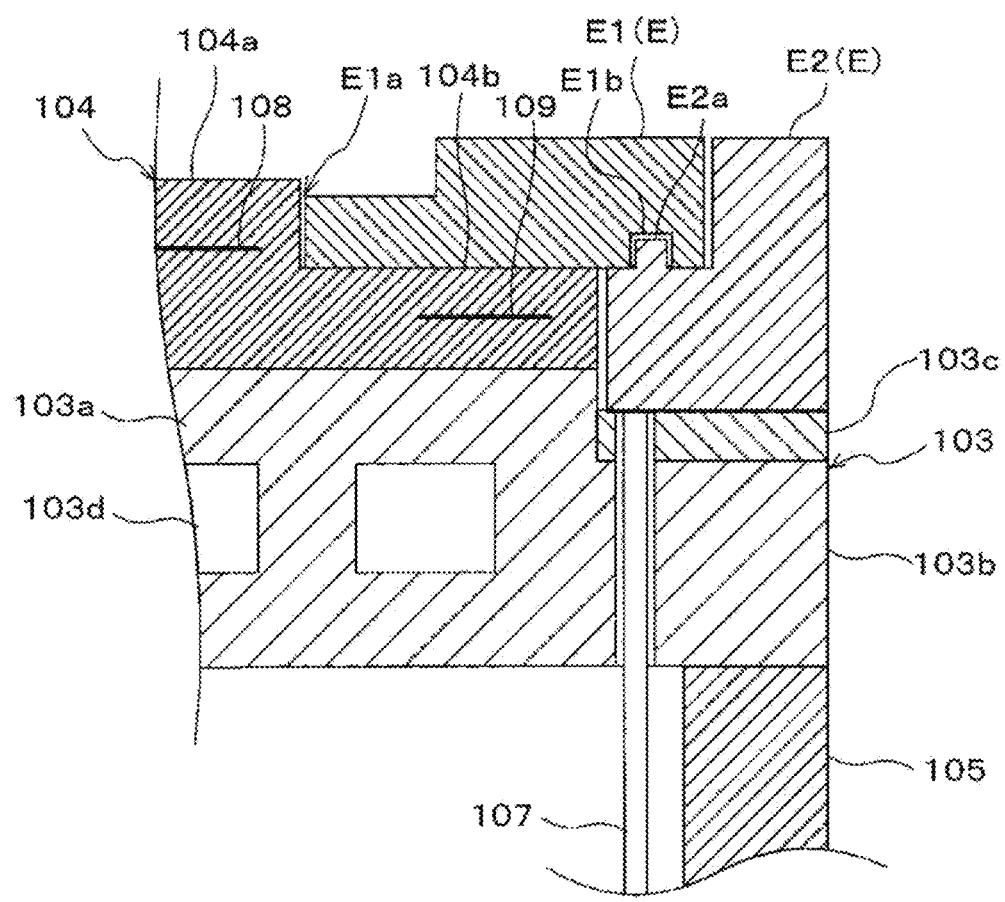
FIG. 8 is a schematic view illustrating the surroundings of the wafer support during the installation process of Example 1.

After the electrostatic chuck 104 is cooled, as shown in FIG. 8, the edge ring E1 is lowered and mounted on the ring mounting portion 104b.

Specifically, the lifting pin 107 supporting the ring set E is lowered, the edge ring E1 is mounted on the ring mounting portion 104b, and the cover ring E2 is mounted on the insulating ring 103c on the mounting portion 103b. After that, a DC voltage from the DC power source (not shown) is applied to the electrode 109 provided in the ring mounting portion 104b, and due to an electrostatic force generated by the DC voltage, the edge ring E1 is adsorbed and held on the upper surface of the ring mounting portion 104b.

Accordingly, a series of installation processes of the edge ring E1 is completed.

Through the installation processes, regardless of the transfer accuracy of the edge ring E1 by the transfer device 70, in a state in which a substantially uniform gap (for example, a gap in a range of 0.1 mm to 0.2 mm) is maintained along an entire circumference between the convex portion of the wafer support 101 (that is, the upper portion of the wafer mounting portion 104a) and the edge ring E1, the edge ring E1 is mounted on the ring mounting portion 104b.

Since a process of removing the edge ring E1 (specifically, the ring set E) is the same as a known process of removing the wafer W from the wafer support 101 using the lifting pin 106, descriptions thereof will be omitted.

Example 2 of Installation Process

Figure 9:
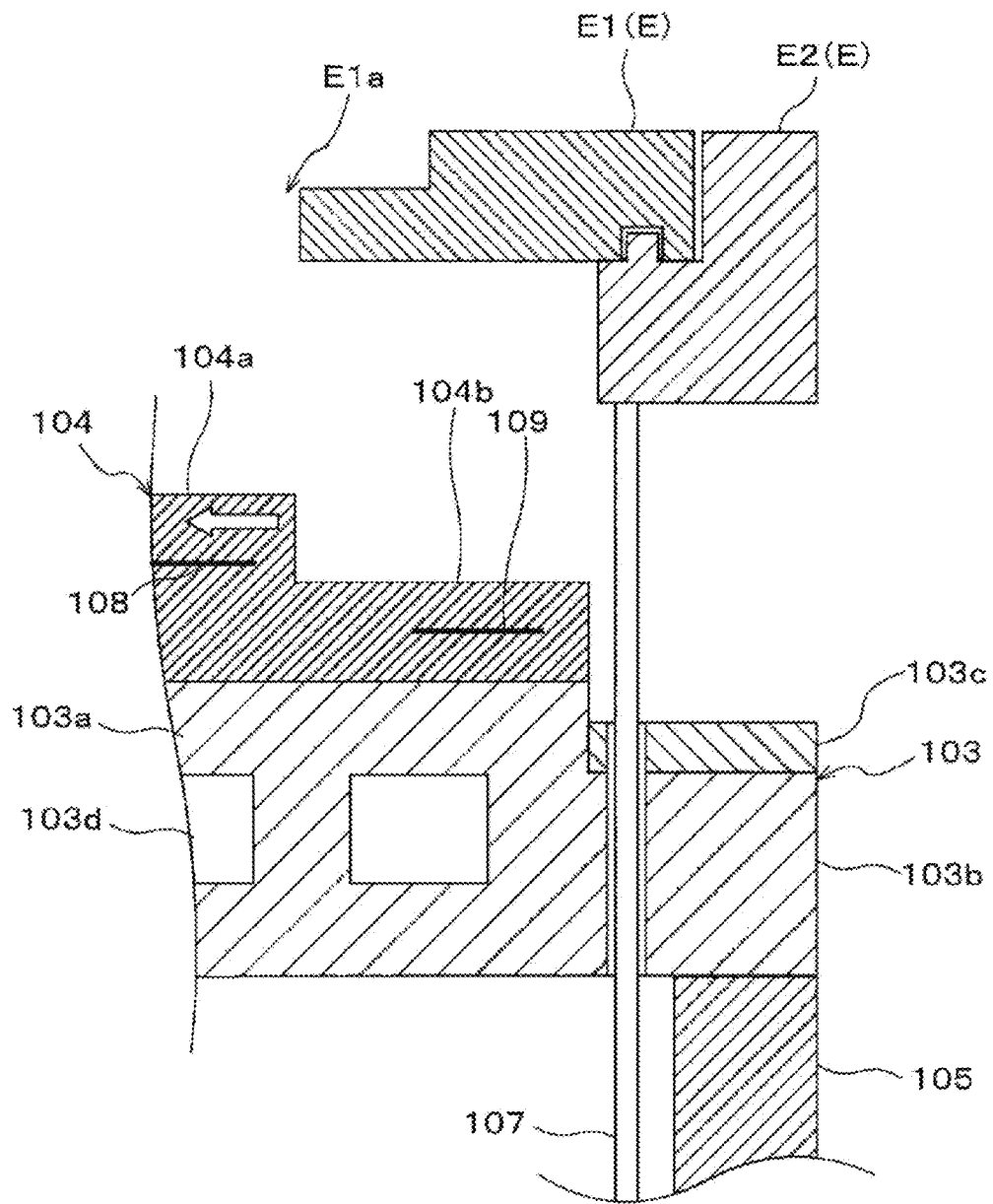
FIG. 9 is a schematic view illustrating the surroundings of the wafer support during an installation process of Example 2.
Figure 10:
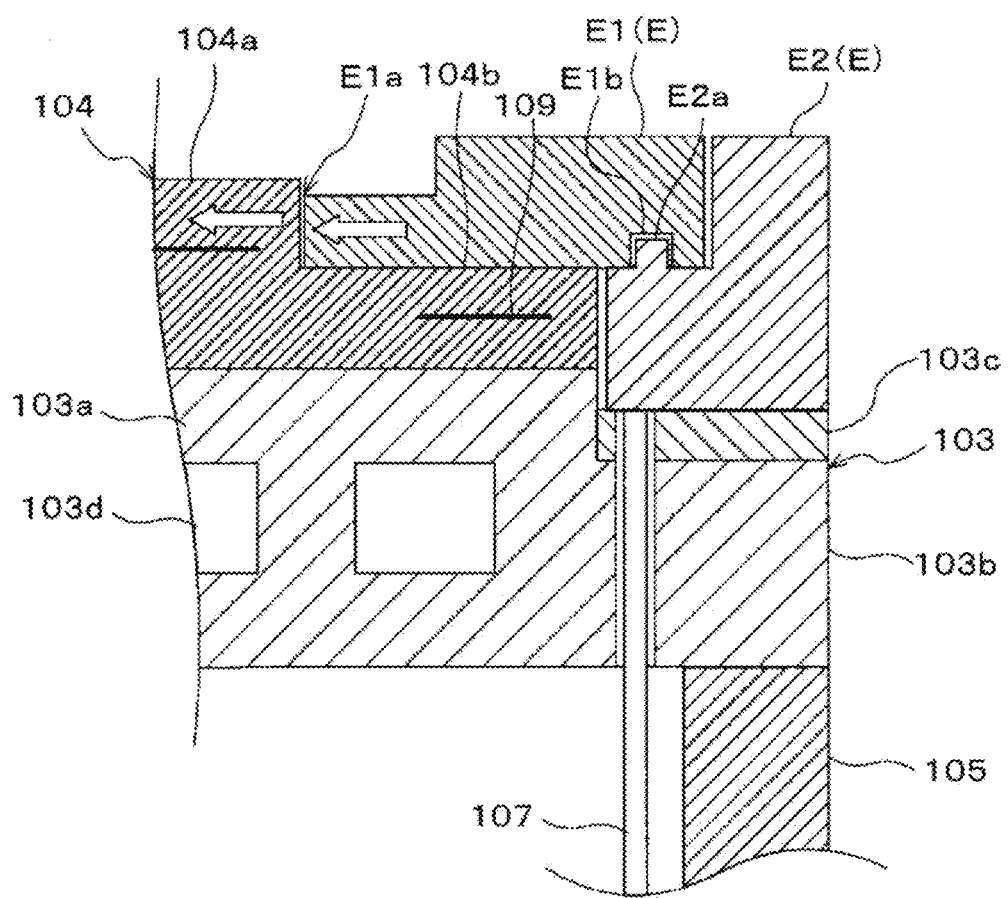
FIG. 10 is a schematic view illustrating the surroundings of the wafer support during the installation process of Example 2.
Figure 11:
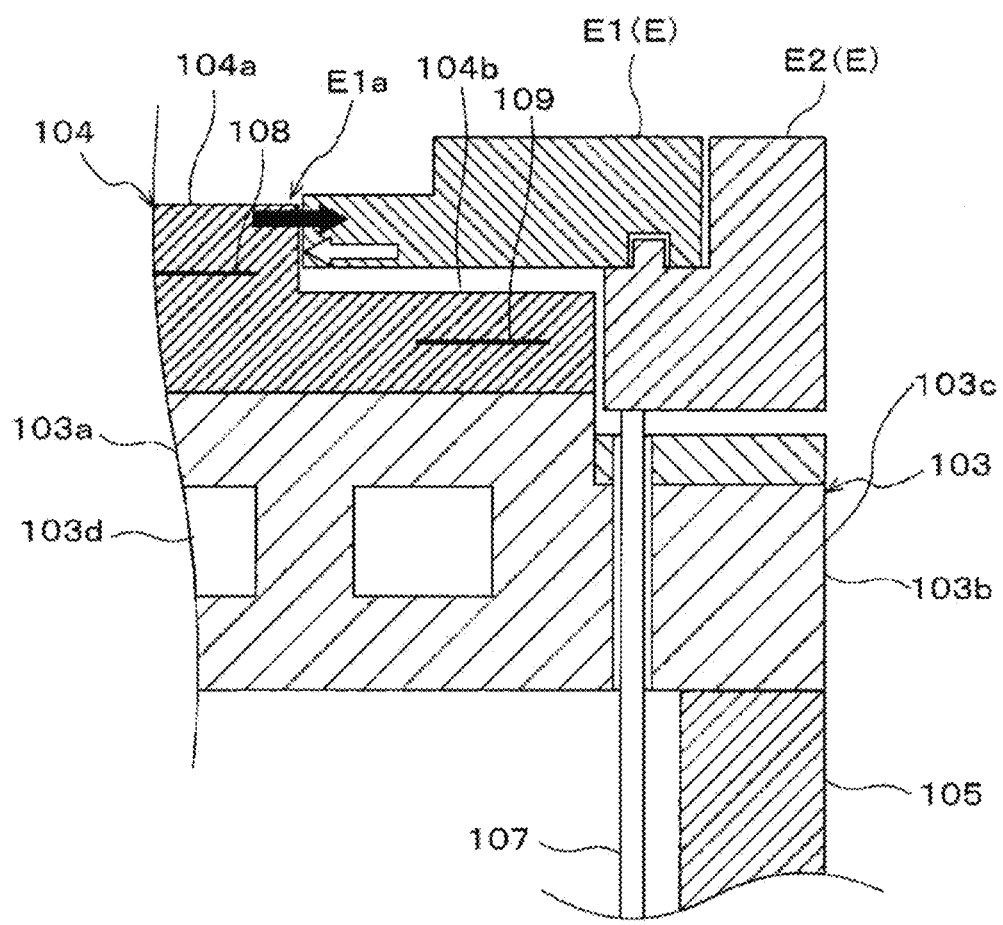
FIG. 11 is a schematic view illustrating the surroundings of the wafer support during the installation process of Example 2.

Next, another example of an installation process of the edge ring E1 will be described with reference to FIGS. 9 to 11. FIGS. 9 to 11 are schematic views illustrating the surroundings of the wafer support 101 during the installation process of the present example. The following processes are performed in a vacuum atmosphere under control of the control device 80.

First, the edge ring E1 is transferred in step S1 described above.

(Step S1a: Contraction of Convex Portion)

Next, before a process of lowering the edge ring E1 in step S2, as shown in FIG. 9, the convex portion of the wafer support 101 (that is, the upper portion of the wafer mounting portion 104a) is cooled to be contracted in a diametric direction thereof.

Specifically, a low-temperature fluid is allowed to flow through the flow path 103d of the base 103 to cool the entire wafer support 101 including the wafer mounting portion 104a of the electrostatic chuck 104, thereby contracting the wafer mounting portion 104a.

Subsequently, the edge ring E1 is lowered in step S2 described above. During the lowering, the convex portion of the wafer support 101 (that is, the upper portion of the wafer mounting portion 104a) is contracted through step S1a described above. Therefore, even when the accuracy of a position at which the edge ring E1 (specifically, the ring set E) is transferred to the lifting pin 107 is poor in a transfer process of step S1, in the process of the lowering of step S2, the edge ring E1 can be prevented from riding on the convex portion of the wafer support 101 (that is, the upper portion of the wafer mounting portion 104a).

(Step S2a)

Next, before a process of moving the edge ring E1 in step S3 to a predetermined position, as shown in FIG. 10, the edge ring E1 is mounted on the ring mounting portion 104b and cooled to be contracted in a diametric direction thereof.

Specifically, the lifting pin 107 supporting the ring set E is lowered, the edge ring E1 is mounted on the ring mounting portion 104b, and the cover ring E2 is mounted on the insulating ring 103c on the mounting portion 103b. After that, a DC voltage from the DC power source (not shown) is applied to the electrode 109 provided in the ring mounting portion 104b, and due to an electrostatic force generated by the DC voltage, the edge ring E1 is adsorbed and held on the upper surface of the ring mounting portion 104b. In addition, a low-temperature fluid is allowed to flow through the flow path 103d of the base 103 to cool the entire wafer support 101 including the ring mounting portion 104b of the electrostatic chuck 104. Furthermore, a heat transfer gas is supplied to the rear surface of the edge ring E1. As a result, the edge ring E1 is cooled to be contracted.

After that, a process of moving the edge ring E1 to a predetermined position is performed in step S3 described above. Specifically, the application of the DC voltage to the electrode 109 is stopped to release the adsorbing and holding of the edge ring E1, the supply of the heat transfer gas is also stopped, and then, the lifting pin 107 is lifted. As a result, the edge ring E1 (specifically, the ring set E) is transferred to the lifting pin 107. After that, the lifting pin 107 is lifted until the edge ring E1 reaches the above-described predetermined position.

As shown in FIG. 11, a process of expanding the convex portion (that is, the upper portion of the wafer mounting portion 104a) of the wafer support 101 is performed in step S4 described above. When the expanding is performed, the edge ring E1 has been contracted through step S2a described above. Therefore, even when an amount of the expansion of the convex portion of the wafer support 101 (that is, the upper portion of the wafer mounting portion 104a) is small in step S4, the eccentricity of the edge ring E1 with respect to the wafer mounting portion 104a can be largely corrected. In other words, even when a heating capacity of the flow path 103d as a temperature adjustment mechanism is low, the eccentricity of the edge ring E1 with respect to the wafer mounting portion 104a can be greatly corrected.

After that, a process of cooling the convex portion (that is, the upper portion of the wafer mounting portion 104a) of the wafer support 101 in step S5 described above to contract the convex portion in a diametric direction thereof is performed, and a process of mounting the edge ring E1 on the ring mounting portion 104b is performed.

Accordingly, a series of installation processes of the edge ring E1 is completed.

Example 3 of Installation Process

Figure 12:
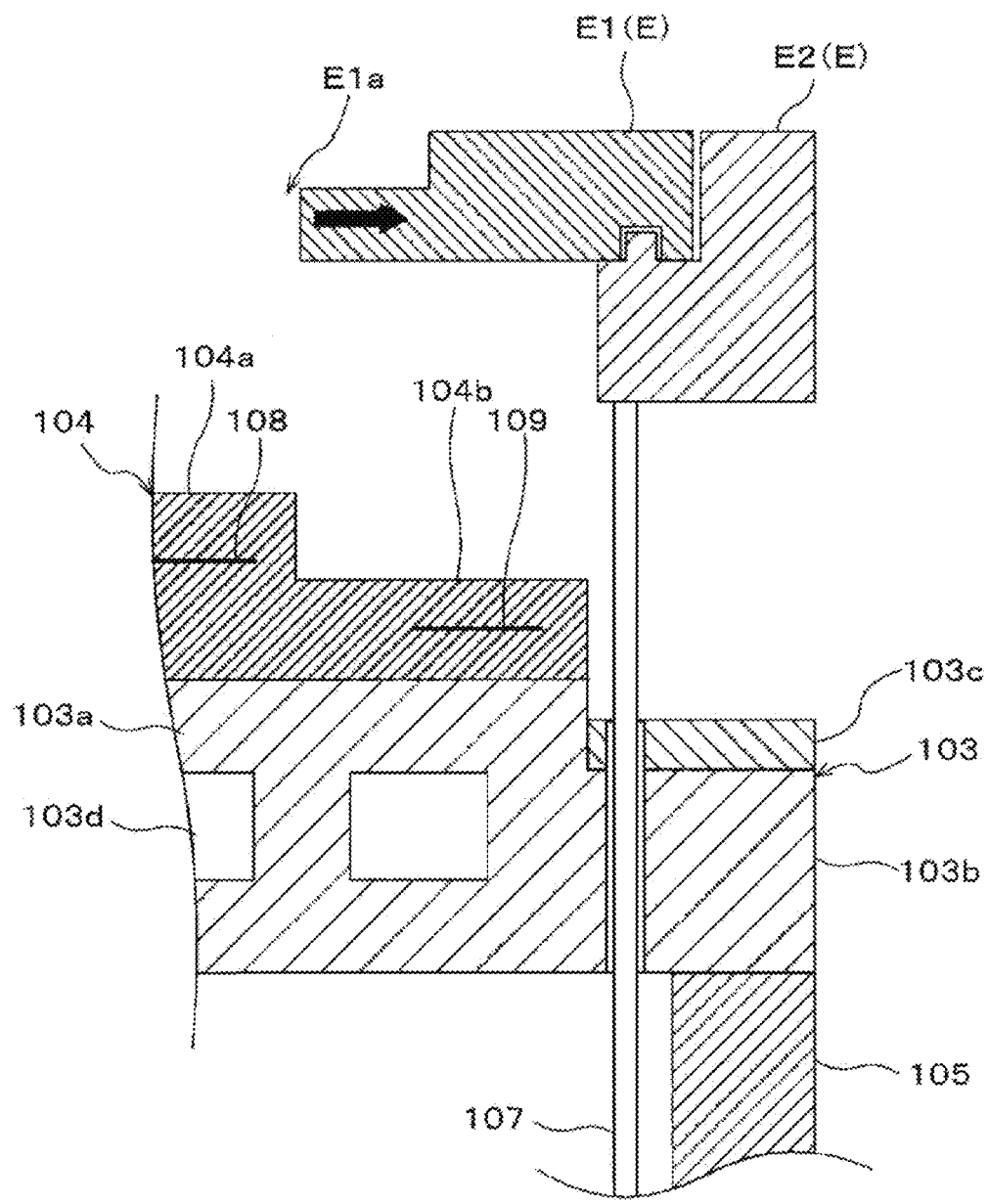
FIG. 12 is a schematic view illustrating the surroundings of the wafer support during an installation process of Example 3.

Next, still another example of an installation process of the edge ring E1 will be described with reference to FIG. 12. FIG. 12 is a schematic view illustrating the surroundings of the wafer support 101 during the installation process of the present example. The following processes are performed in a vacuum atmosphere under control of the control device 80.

In the installation process of the present example, a process of transferring the edge ring E1 is performed in step S1, similarly to Example 1 or 2 of the installation process described above.

In Example 2 of the installation process, the edge ring E1 accommodated in the accommodation module 61 is transferred to the processing module 60 at room temperature. On the other hand, in the present example, as shown in FIG. 12, the edge ring E1 accommodated in the accommodation module 61 is transferred to the processing module 60 in a state of being heated to a high temperature higher than or equal to room temperature and expanded.

Specifically, the ring set E in the accommodation module 61 is heated by the heating device 61a. The heated ring set E is held by the transfer arm 71 of the transfer device 70. Next, the transfer arm 71 holding the ring set E is inserted into the depressurized plasma processing chamber 100 of the processing module 60, which is the installation target, through the carry-in outlet (not shown). The ring set E held by the transfer arm 71 is transferred above the ring mounting portion 104b. Next, the lifting pin 107 is lifted, and the ring set E is transferred from the transfer arm 71 to the lifting pin 107. After that, the transfer arm 71 is drawn out of the plasma processing chamber 100, that is, the transfer arm 71 is retracted.

Subsequent processes are similar to those of Example 1 or Example 2 of the installation process described above. That is, in the present example, the edge ring E1 has been expanded in the process of lowering the edge ring E1 in step S2. Therefore, even when the accuracy of a position at which the edge ring E1 (specifically, the ring set E) is transferred to the lifting pin 107 is poor in the transfer process of step S1, in the process of the lowering of step S2, the edge ring E1 can be prevented from riding on the convex portion of the wafer support 101 (that is, the upper portion of the wafer mounting portion 104a).

Furthermore, expanding the edge ring E1 in advance as in the present example is combined with contracting the convex portion of the wafer support 101 (that is, the upper portion of the wafer mounting portion 104a) in advance as in step S1a in Example 2 of the above-described installation process, thereby more surely preventing the above-described riding of the edge ring E1.

As described above, in the aligning of the position of the edge ring according to the present embodiment, the edge ring E1 is moved to a predetermined position at which the convex portion of the wafer support 101 (that is, the upper portion of the wafer mounting portion 104a) is in a state of being inserted into the hole E1a of the edge ring E1. After that, the convex portion of the wafer support 101 (that is, the upper portion of the wafer mounting portion 104a) is heated to be expanded in a diametric direction thereof. Therefore, when the edge ring E1 is eccentric with respect to the wafer mounting portion 104a, the central axis of the wafer mounting portion 104a of the electrostatic chuck 104 can be brought closer to the central axis of the edge ring E1. That is, eccentricity can be corrected. Therefore, according to the present embodiment, the edge ring E1 can be precisely mounted on the wafer support 101 regardless of the transfer accuracy of the edge ring E1 by the transfer device 70.

In the present embodiment, a configuration is applied in which the cover ring E2 is used, and when the edge ring E1 is installed, the edge ring E1 is vertically moved in a state of being integrated with the cover ring E2. A technique according to the present disclosure is not limited to this configuration and can be applied to a configuration in which, when the edge ring E1 is installed, the edge ring E1 is vertically moved alone. However, when the eccentricity of the edge ring E1 with respect to the wafer mounting portion 104a is corrected, in the former configuration, the edge ring E1 is moved on the cover ring E2 supported by the lifting pin 107, and in the latter configuration, the edge ring E1 is moved on the lifting pin 107. Therefore, in the former configuration, the eccentricity can be corrected more smoothly.

In addition, in the aligning of the position of the edge ring E1 according to the present embodiment, the edge ring E1 is aligned with the electrostatic chuck 104, on which the wafer W to be processed is mounted, rather than the base 103. Therefore, even when the electrostatic chuck is misaligned and fixed with respect to the base 103, a positional relationship between the electrostatic chuck 104 and the edge ring E1 can be appropriately made.

Second Embodiment

<Processing Module 60a>

Figure 13:
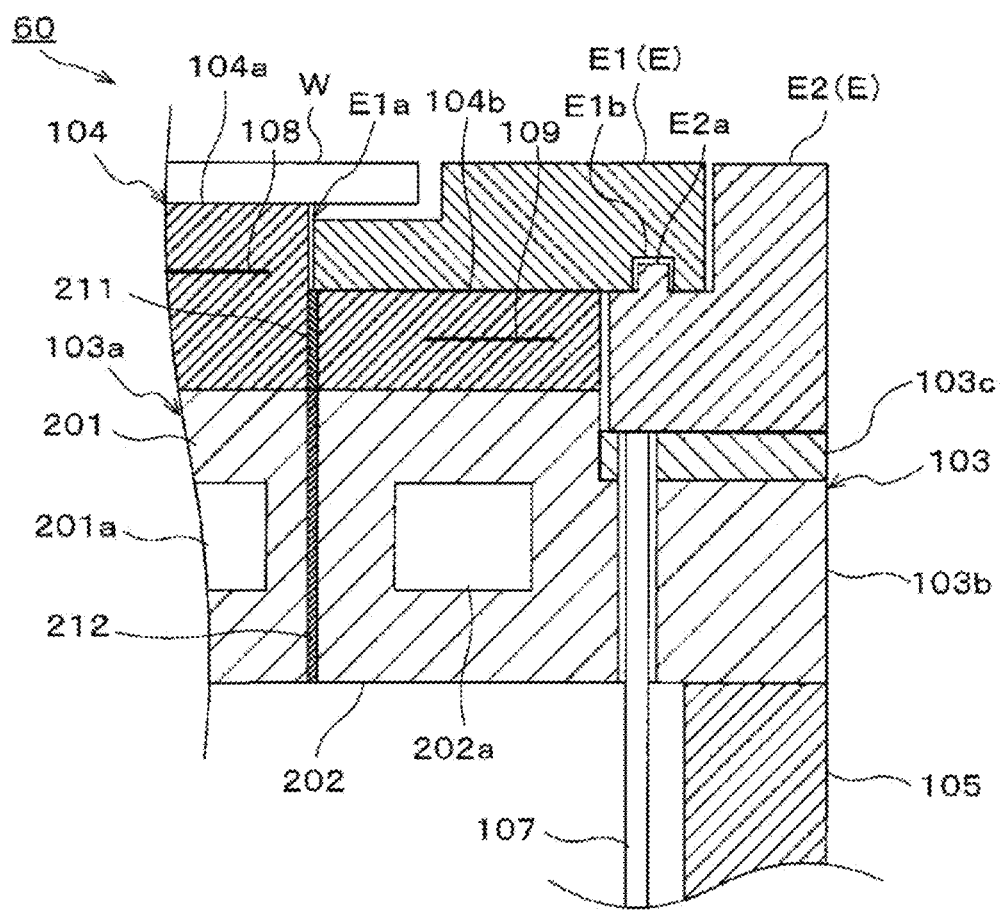
FIG. 13 is a partially enlarged cross-sectional view illustrating an outline of a configuration of a processing module according to a second embodiment.

FIG. 13 is a partially enlarged cross-sectional view illustrating an outline of a configuration of a processing module according to a second embodiment.

In a processing module 60a of FIG. 13, an electrostatic chuck 104 is separated into a wafer mounting portion 104a and a ring mounting portion 104b.

In addition, a fixing portion 103a is separated into a first fixing portion 201 to which the wafer mounting portion 104a of the electrostatic chuck 104 is fixed and a second fixing portion 202 to which the ring mounting portion 104b is fixed. Furthermore, a first flow path 201a for a temperature adjustment fluid is formed in the first fixing portion 201, a second flow path 202a for a temperature adjustment fluid is formed in the second fixing portion 202, and a flow of the temperature control fluid to the first flow path 201a and a flow of the temperature control fluid to the second flow path 202a are controlled independently of each other. The second flow path 202a constitutes a temperature adjustment mechanism which adjusts a temperature of the ring mounting portion 104b independently of a convex portion of a wafer support 101 (that is, an upper portion of the wafer mounting portion 104a). Meanwhile, the first flow path 201a constitutes a temperature adjustment mechanism which adjusts a temperature of the convex portion (that is, the upper portion of the wafer mounting portion 104a) independently of the temperature of the ring mounting portion 104b.

In order to improve the heat insulation between the wafer mounting portion 104a and the ring mounting portion 104b, a heat insulating portion 211 made of a heat insulating material may be provided between the wafer mounting portion 104a and the ring mounting portion 104b. Similarly, in order to improve the heat insulation between the first fixing portion 201 and the second fixing portion 202, a heat insulating portion 212 made of a heat insulating material may be provided between the first fixing portion 201 and the second fixing portion 202.

When the processing module 60a is used, the edge ring E1 may be installed similarly to a case in which the processing module 60 of the first embodiment is used. For example, even when the processing module 60a is used, the edge ring E1 may be installed according to Examples 1 to 3 of the installation process described above. In this case, in a process of heating to expand the convex portion of the wafer support 101 in step S4 (that is, the upper portion of the wafer mounting portion 104a) in a diametric direction thereof, the ring mounting portion 104b may not be heated, and the edge ring E1 may be mounted on the ring mounting portion 104b. In other words, a "predetermined position", which is a position of the edge ring E1 in the process of expanding the convex portion of the wafer support 101 in step S4 (that is, the upper portion of the wafer mounting portion 104a), may be a position at which the edge ring E1 is mounted on the ring mounting portion 104b rather than a position at which the edge ring E1 is separated from the ring mounting portion 104b.

However, in the process of expanding the convex portion of the wafer support 101 in step S4 (that is, the upper portion of the wafer mounting portion 104a), the edge ring E1 is separated from the ring mounting portion 104b, thereby preventing an affect due to the edge ring E1 rubbing against the ring mounting portion 104b when moved by being pushed by the convex portion.

In addition, in the process of expanding the convex portion of the wafer support 101 in step S4 (that is, the upper portion of the wafer mounting portion 104a), the edge ring E1 may be mounted on the ring mounting portion 104b as follows. That is, in the process of expanding the convex portion of the wafer support 101 in step S4, a temperature adjustment of the ring mounting portion 104b may be controlled using the second flow path 202a such that the edge ring E1 mounted on the ring mounting portion 104b is cooled to be contracted in a diametric direction thereof. Specifically, while a high-temperature fluid is allowed to flow through the first flow path 201a to heat the wafer mounting portion 104a to expand the wafer mounting portions 104a, a low-temperature fluid may be allowed to flow through the second flow path 202a, thereby cooling the ring mounting portion 104b and also cooling the edge ring E1 mounted on the ring mounting portion 104b to contract the edge ring E1.

Example 4 of Installation Process

Figure 14:
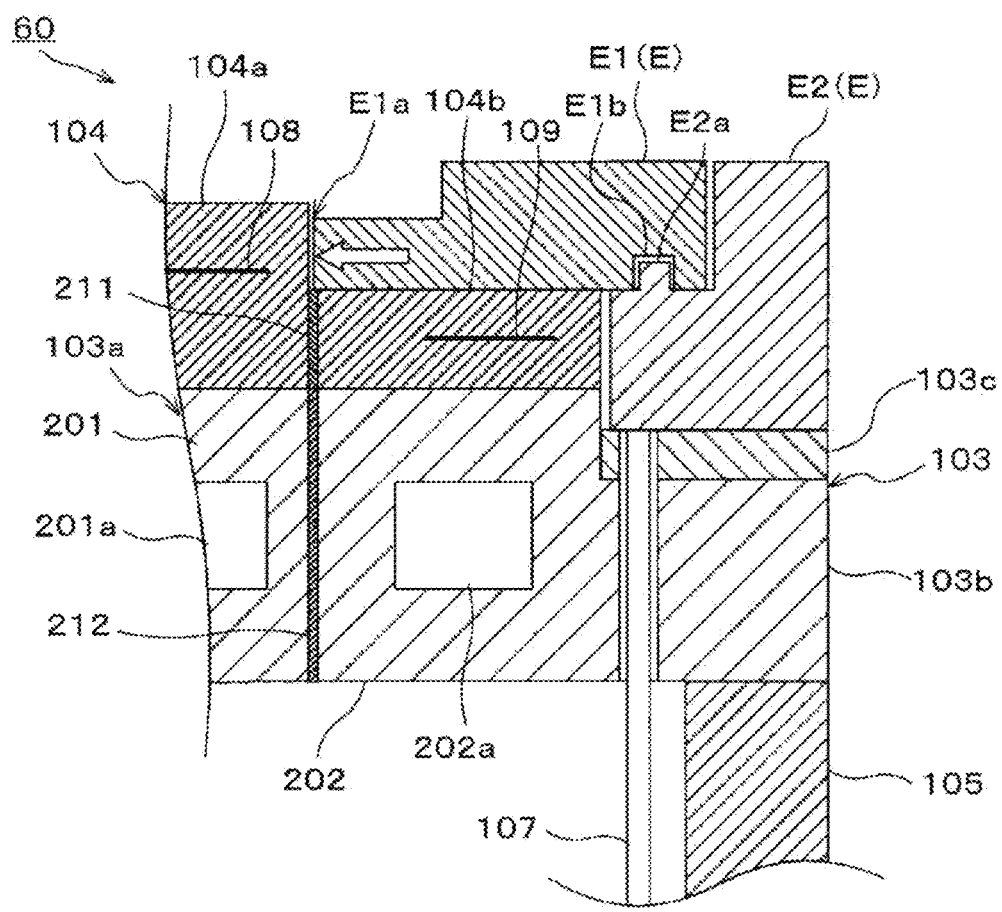
FIG. 14 is a schematic view illustrating the surroundings of a wafer support during an installation process of Example 4.

Next, a specific example of an installation process of the edge ring E1 when the processing module 60a is used will be described with reference to FIG. 14. FIG. 14 is a schematic view illustrating the surroundings of the wafer support 101 during the installation process of the present example. The following processes are performed in a vacuum atmosphere under control of a control device 80.

First, the edge ring E1 in step S1 described above is transferred, and the edge ring E1 in step S2 is lowered. Similar to step S1a in Example 2 of the installation process described above, the convex portion of the wafer support 101 (that is, the upper portion of the wafer mounting portion 104a) is cooled in a diametric direction thereof before the edge ring E1 in step S2 is lowered.

(Step S3': Mounting of Edge Ring E1)

Next, the edge ring E1 is moved and mounted on the ring mounting portion 104b in a state in which the convex portion of the wafer support 101 (that is, the upper portion of the wafer mounting portion 104a) inserted into a hole E1a of the edge ring E1.

Specifically, a lifting pin 107 receiving a ring set E from a transfer arm 71 is lowered until the edge ring E1 is mounted on the ring mounting portion 104b.

(Step S4: Expansion of Convex Portion)

After step S3, as shown in FIG. 14, the ring mounting portion 104b on which the edge ring E1 is mounted is cooled to cool the edge ring E1 so as to contract the edge ring E1 in a diametric direction thereof. More specifically, a low-temperature fluid is allowed to flow through the second flow path 202a of the second fixing portion 202 of the base 103 to cool only the ring mounting portion 104b without cooling the wafer mounting portion 104a of the electrostatic chuck 104, thereby cooling the edge ring E1 mounted on the ring mounting portion 104b. When the edge ring E1 is eccentric with respect to the wafer mounting portion 104a when contracted as described above, the edge ring E1 comes into contact with the convex portion of the wafer support 101 (that is, the upper portion of the wafer mounting portion 104a). When the edge ring E1 continues to be contracted after that, a central axis of the wafer mounting portion 104a of the electrostatic chuck 104 and the central axis of the edge ring E1 approach each other as the edge ring E1 is contracted.

Such a process is ended, for example, when a predetermined time has elapsed after a low-temperature fluid has started to flow.

Accordingly, a series of installation processes of the edge ring E1 is completed.

As described above, according to the present embodiment, when the edge ring E1 is eccentric with respect to the wafer mounting portion 104a, the central axis of the wafer mounting portion 104a of the electrostatic chuck 104 and the central axis of the edge ring E1 can be brought closer to each other. That is, eccentricity can be corrected. Therefore, even in the present embodiment, the edge ring E1 can be precisely mounted on the wafer support 101 regardless of the transfer accuracy of the edge ring E1 by a transfer device 7.

Modified Example

In the above example, although a heating device 61a for heating an edge ring E1 is provided inside an accommodation module 61, it may be provided outside the accommodation module 61. In addition, the edge ring E1 may be heated using a temperature control mechanism of a processing module 60 without performing plasma processing.

Furthermore, in the above example, although the edge ring E1 is accommodated in the accommodation module 61 connected to a transfer module 50, it may be accommodated in a FOUP mounted on a load port 32 like a wafer W.

Although various exemplary embodiments have been described above, various additions, omissions, substitutions, and changes may be made without being limited to the above-describe exemplary embodiments. In addition, elements in different embodiments may be combined to form other embodiments.

The invention claimed is:

1. An apparatus for plasma processing comprising:
a support configured to support a substrate and an edge ring disposed around the substrate;
a lifting mechanism including a driver, the lifting mechanism being configured to vertically move the edge ring, and
a control device, wherein:
the edge ring has a hole that is concentric with the edge ring,
the support includes:
a wafer mounting portion having an upper convex portion which protrudes upward and on which the substrate is mounted;
a ring mounting portion on which the edge ring is mounted in a state in which the upper convex portion is inserted into the hole of the edge ring; and
a first flow path configured to introduce a temperature adjustment fluid into the support to adjust a temperature of the upper convex portion,
the hole of the edge ring and the upper convex portion of the support have a shape corresponding to each other in a plan view, and
the control device includes a processor and a memory with a computer readable program stored therein that upon execution of the computer readable program by the processor configures the control device to control the lifting mechanism and the first flow path to perform:
a process of moving the edge ring to a predetermined position at which the upper convex portion of the support is inserted into the hole of the edge ring,
a process of, after the process of the moving, heating the upper convex portion of the wafer mounting portion via the first flow path to expand the upper convex portion in a diametric direction thereof so that the upper convex portion pushes the edge ring to correct eccentricity of the edge ring relative to the upper convex portion, and
a process of, after the process of the heating, cooling the upper convex portion of the support via the first flow path to contract the upper convex portion in the diametric direction thereof to form a gap between the upper convex portion and the edge ring to prevent rubbing during subsequent movement of the edge ring.

2. The apparatus of claim 1, wherein:
the process of moving the edge ring includes lowering the edge ring such that the upper convex portion of the support is inserted into the hole of the edge ring, and
the control device is further configured to control the lifting mechanism and the first flow path to perform, before the process of the moving, cooling the upper convex portion of the support to contract the upper convex portion of the support in the diametric direction.

3. The apparatus of claim 1, wherein:
the first flow path adjusts a temperature of the ring mounting portion together with the temperature of the upper convex portion of the support, and
the control device is further configured to control the first flow path to perform a process of, before the process of the moving, mounting the edge ring on the ring mounting portion and cooling the edge ring to contract the edge ring in a diametric direction thereof to facilitate alignment of the edge ring with the upper convex portion.

4. The apparatus of claim 1, wherein:
the support includes a second flow path configured to adjust a temperature of the ring mounting portion independently of the temperature of the upper convex portion;
the predetermined position is a position at which the edge ring is mounted on the ring mounting portion; and
in the process of the heating, the control device controls the second flow path to cool the edge ring mounted on the ring mounting portion to contract the edge ring in a diametric direction thereof.

5. The apparatus of claim 1, wherein:
the predetermined position is a position at which the edge ring is separated from the ring mounting portion; and
the control device is configured to control the lifting mechanism to perform a process of, after the process of the heating, lowering the edge ring from the predetermined position and mounting the edge ring on the ring mounting portion.

6. The apparatus of claim 5, wherein the control device is configured to control the first flow path to perform a process of, after the process of the heating and before the process of the mounting, stopping the heating of the upper convex portion of the support and cooling the upper convex portion to contract the upper convex portion in the diametric direction to maintain the gap between the convex portion and the edge ring.

7. The apparatus of claim 1, wherein the lifting mechanism is configured to vertically move the edge ring in a state in which the edge ring is integrated with a cover ring having an outer diameter and an inner diameter which are greater than those of the edge ring respectively, the cover ring facilitating stable movement of the edge ring during alignment of the edge ring with the upper convex portion.

8. The apparatus of claim 7, wherein the control device is configured to control the lifting mechanism to move the edge ring and the cover ring as a unit to the predetermined position during the process of correcting the eccentricity of the edge ring relative to the upper convex portion.

9. The apparatus of claim 8, wherein the edge ring is moved on the cover ring supported by the lifting mechanism during the process of the heating to correct the eccentricity of the edge ring relative to the upper convex portion, reducing friction between the edge ring and the ring mounting portion.

10. An apparatus for plasma processing comprising:
a support configured to support a substrate and an edge ring disposed around the substrate;
a lifting mechanism including a driver, the lifting mechanism being configured to vertically move the edge ring; and
a control device,
wherein:
the edge ring has a hole that is concentric with the edge ring;
the support includes:
a wafer mounting portion having an upper convex portion which protrudes upward and on which the substrate is mounted;
a ring mounting portion on which the edge ring is mounted in a state in which the upper convex portion is inserted into the hole of the edge ring; and
a first flow path configured to introduce a temperature adjustment fluid into the support to adjust a temperature of the ring mounting portion independently of a temperature of the upper convex portion,
the hole of the edge ring and the upper convex portion of the support have a shape corresponding to each other in a plan view, and
the control device includes a processor and a memory with a computer readable program stored therein that upon execution of the computer readable program by the processor configures the control device to:
control the lifting mechanism and the first flow path to perform:
a process of moving and mounting the edge ring on the ring mounting portion in a state in which the upper convex portion of the support is inserted into the hole of the edge ring,
a process of, after the process of the mounting cooling the ring mounting portion via the first flow path on which the edge ring is mounted to cool and contract the edge ring in a diametric direction thereof to form a gap between the upper convex portion and the edge ring to prevent the edge ring from rubbing against the upper convex portion once it is lowered, and
a process of, after plasma processing is ended and the substrate is unloaded from a chamber of the apparatus for plasma processing, lifting the edge ring via the lifting mechanism to cause the lifting mechanism to receive the edge ring held by a transfer arm for unloading from the chamber.

11. The apparatus of claim 10, wherein:
the support includes a second flow path configured to adjust the temperature of the upper convex portion independently of the temperature of the ring mounting portion; and
the control device is configured to control the lifting mechanism and the second flow path to perform a process of lowering the edge ring such that the upper convex portion of the support is inserted into the hole of the edge ring and a process of, before the process of the lowering, cooling the upper convex portion of the support via the second flow path to contract the upper convex portion of the support in a diametric direction to facilitate insertion of the upper convex portion into the hole of the edge ring.

12. A plasma processing system comprising:
the apparatus for plasma processing of claim 1;
a heating device including a light-emitting element or a gas, the heating device being configured to heat the edge ring, and
a transfer device including at least one of a transfer arm, a rotary table and a base, the transfer device being configured to transfer the edge ring,
wherein the control device is configured to control the heating device and the transfer device to perform a process of heating the edge ring in the accommodation part to expand the edge ring in a diametric direction thereof and transferring the edge ring to the apparatus for plasma processing in a state of being heated and expanded to facilitate insertion of the upper convex portion into the hole of the edge ring during alignment of the edge ring with the upper convex portion.

13. A plasma processing system comprising:
the apparatus for plasma processing of claim 10;
a heating device including a light-emitting element or a gas, the heating device being configured to heat the edge ring; and
a transfer device including at least one of a transfer arm, a rotary table and a base, the transfer device being configured to transfer the edge ring;
wherein the control device is configured to control the heating device and the transfer device to perform a process of heating the edge ring in the accommodation part to expand the edge ring in a diametric direction thereof and transferring the edge ring to the apparatus for plasma processing in a state of being heated and expanded to facilitate insertion of the upper convex portion into the hole of the edge ring during alignment of the edge ring with the upper convex portion.

14. The apparatus of claim 1, wherein an upper surface of the upper convex portion has a circular shape in a plan view, corresponding to a circular shape of the hole of the edge ring to ensure precise alignment during the process of correcting the eccentricity of the edge ring relative to the upper convex portion.

15. The apparatus of claim 1, further comprising a cover ring surrounding the edge ring,
   wherein the edge ring includes a ring-shaped axially extending recess, and
   the cover ring includes a ring-shaped axially extending protrusion that engages the ring-shaped axially extending recess of the edge ring to enhance alignment during the process of correcting the eccentricity of the edge ring relative to the upper convex portion.

16. The apparatus of claim 10, wherein an upper surface of the upper convex portion bas a circular shape in a plan view, corresponding to a circular shape of the hole of the edge ring to ensure precise alignment during the process of correcting the eccentricity of the edge ring relative to the upper convex portion.

17. The apparatus of claim 10, further comprising a cover ring surrounding the edge ring,
   wherein the edge ring includes a ring-shaped axially extending recess, and
   the cover ring includes a ring-shaped axially extending protrusion that engages the ring-shaped axially extending recess of the edge ring to enhance alignment during the process of correcting the eccentricity of the edge ring relative to the upper convex portion.

18. The apparatus of claim 12, further comprising a cover ring surrounding the edge ring,
   wherein the edge ring includes a ring-shaped axially extending recess, and
   the cover ring includes a ring-shaped axially extending protrusion that engages the ring-shaped axially extending recess of the edge ring to enhance alignment during the process of correcting the eccentricity of the edge ring relative to the upper convex portion.

19. The apparatus of claim 1, wherein the control device is further programmed to control the first flow path to cause the upper convex portion of the support to be cooled and to contract in the diametric direction thereof to form a gap between the upper convex portion of the support and the edge ring after the process of the heating to prevent rubbing during subsequent movement of the edge ring.

* * * * *